(12) United States Patent
Lee et al.

(10) Patent No.: US 8,200,862 B2
(45) Date of Patent: *Jun. 12, 2012

(54) LOW-POWER USB FLASH CARD READER USING BULK-PIPE STREAMING WITH UAS COMMAND RE-ORDERING AND CHANNEL SEPARATION

(75) Inventors: Charles C. Lee, Cupertino, CA (US); Frank Yu, Palo Alto, CA (US); Abraham C. Ma, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 25 days.

This patent is subject to a terminal disclaimer.

(21) Appl. No.: 12/887,477

(22) Filed: Sep. 21, 2010

(65) Prior Publication Data

US 2011/0016267 A1 Jan. 20, 2011

Related U.S. Application Data

(63) Continuation-in-part of application No. 12/254,428, filed on Oct. 20, 2008, now Pat. No. 7,849,242, which is a continuation-in-part of application No. 10/803,597, filed on Mar. 17, 2004, now Pat. No. 7,457,897, application No. 12/887,477, which is a continuation-in-part of application No. 11/925,933, filed on Oct. 27, 2007, now abandoned, and a continuation-in-part of application No. 11/926,636, filed on Oct. 29, 2007, now Pat. No. 7,657,692, and a continuation-in-part of application No. 11/928,124, filed on Oct. 30, 2007, now Pat. No. 7,707,321, and a continuation-in-part of application No. 12/347,306, filed on Dec. 31, 2008, now Pat. No. 8,112,574, and a continuation-in-part of application No. 12/576,216, filed on Oct. 8, 2009, and a continuation-in-part of application No. 11/927,549, filed on Oct. 29, 2007, now Pat. No. 7,440,286, and a continuation-in-part of application No. 12/608,842, filed on Oct. 29, 2009, now Pat. No. 7,844,763.

(51) Int. Cl.
*G06F 13/12* (2006.01)
*G06F 13/00* (2006.01)
*G06F 12/02* (2006.01)

(52) U.S. Cl. .................. 710/62; 710/74; 710/8; 710/10; 710/105; 710/63; 710/72; 710/100; 710/315; 711/100; 711/103; 711/115

(58) Field of Classification Search ................ 710/8, 10, 710/62, 63, 72, 100, 105, 315; 711/103
See application file for complete search history.

(56) References Cited

U.S. PATENT DOCUMENTS

| 6,721,337 | B1 * | 4/2004 | Kroeger et al. | 370/477 |
| 7,418,524 | B2 * | 8/2008 | Beasley et al. | 710/2 |

(Continued)

*Primary Examiner* — Tammara Peyton
(74) *Attorney, Agent, or Firm* — Stuart T. Auvinen; gPatent LLC

(57) ABSTRACT

A flash-card reader improves transmission efficiency by using bulk streaming of multiple pipes. A bulk data-out pipe carries host write data to the card reader and can operate in parallel with a bulk data-in pipe that carries host read data that was read from a flash card attached to the card reader. Status packets do not block data packets since the he status packets are buffered through a separate status pipe, and commands are buffered through a command pipe. Flash data from multiple flash cards are interleaved as separate endpoints that share the bulk data-in pipe. A data in/out streaming state machine controls streaming bulk data through the bulk data-in and data-out pipes, while a status streaming state machine controls streaming status packets through the status pipe. Transaction overhead is reduced using bulk streaming where packets for several commands are combined into the same bulk streams.

21 Claims, 27 Drawing Sheets

U.S. PATENT DOCUMENTS

| | | | |
|---|---|---|---|
| 2004/0111668 A1* | 6/2004 | Cragun et al. | 715/512 |
| 2005/0160223 A1* | 7/2005 | Chen et al. | 711/115 |
| 2006/0198113 A1* | 9/2006 | Lambert et al. | 361/783 |
| 2008/0046608 A1* | 2/2008 | Lee et al. | 710/30 |
| 2010/0275037 A1* | 10/2010 | Lee et al. | 713/189 |
| 2011/0022769 A1* | 1/2011 | Hung et al. | 710/313 |
| 2011/0106989 A1* | 5/2011 | Solomon et al. | 710/63 |
| 2011/0161530 A1* | 6/2011 | Pietri et al. | 710/14 |

* cited by examiner

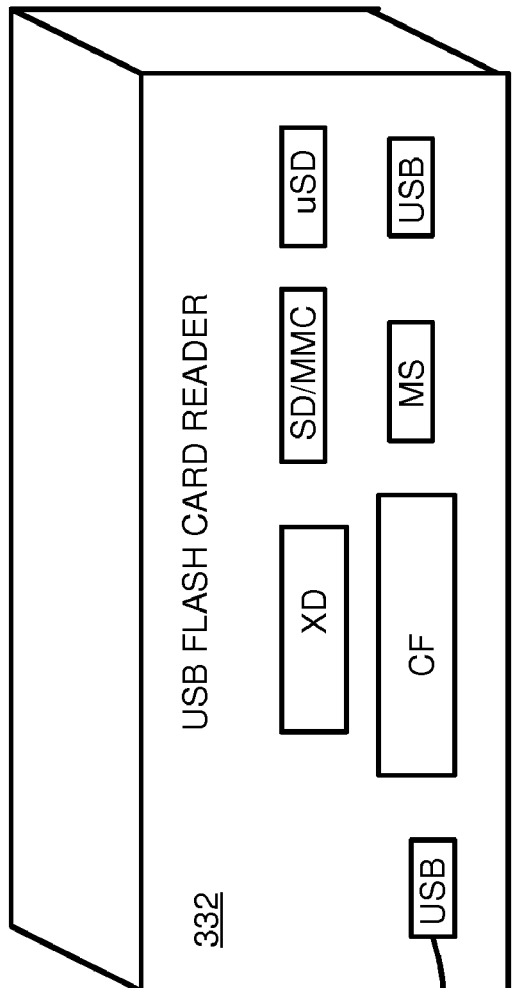
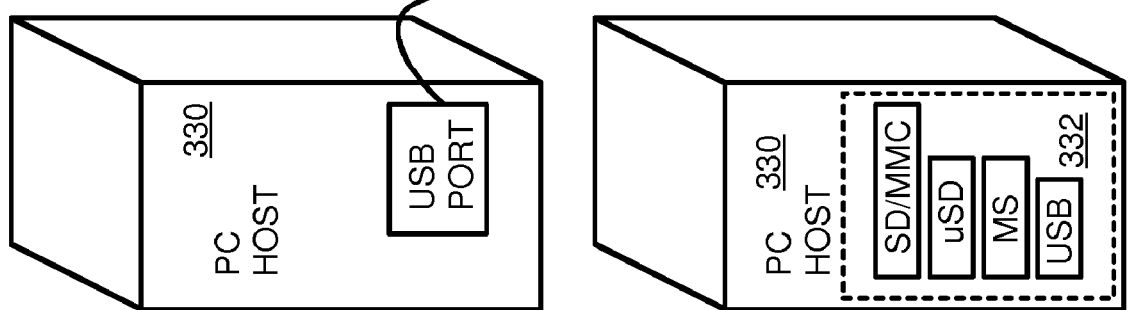
FIG. 1A
FIG. 1B

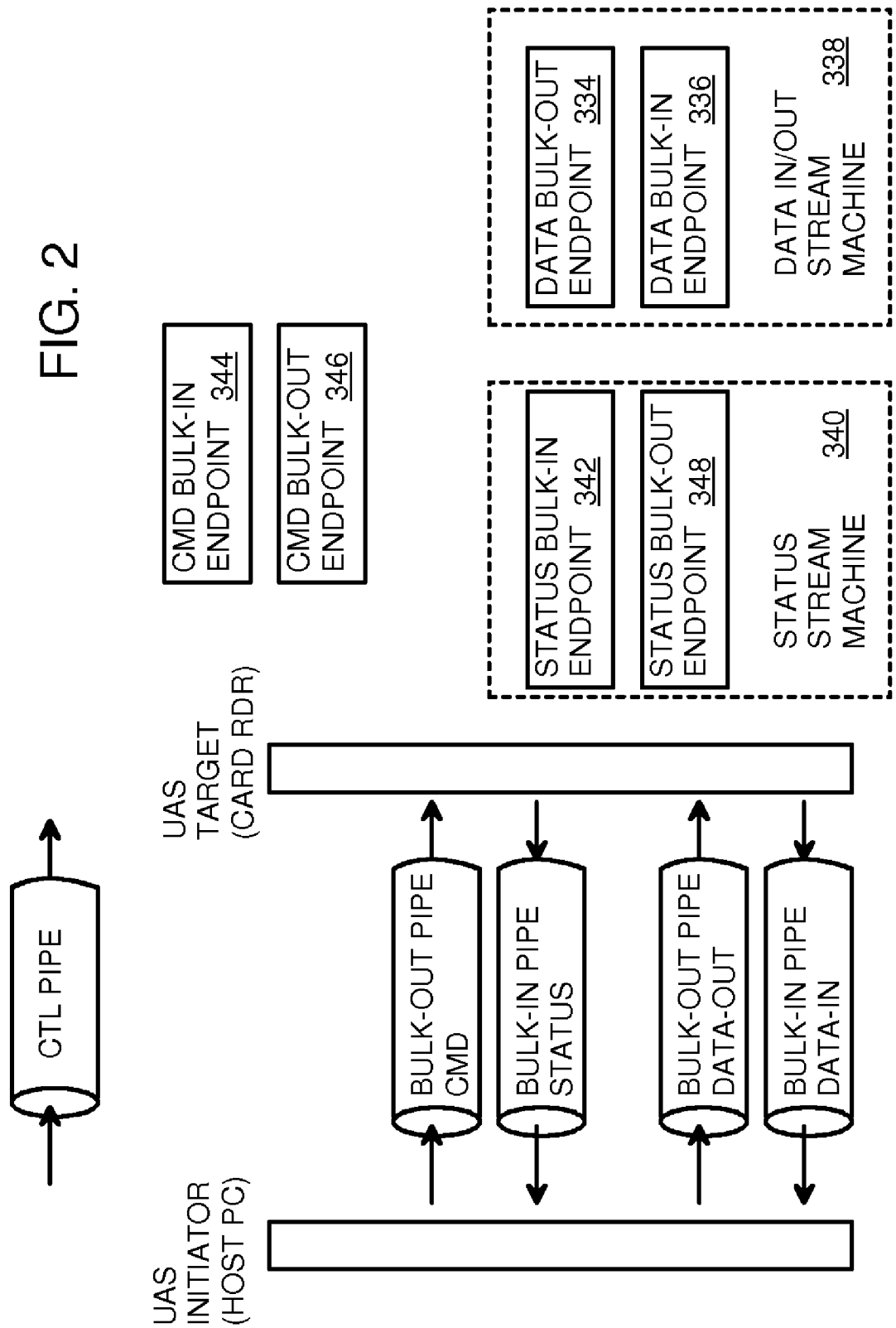

TRANSMIT PATH

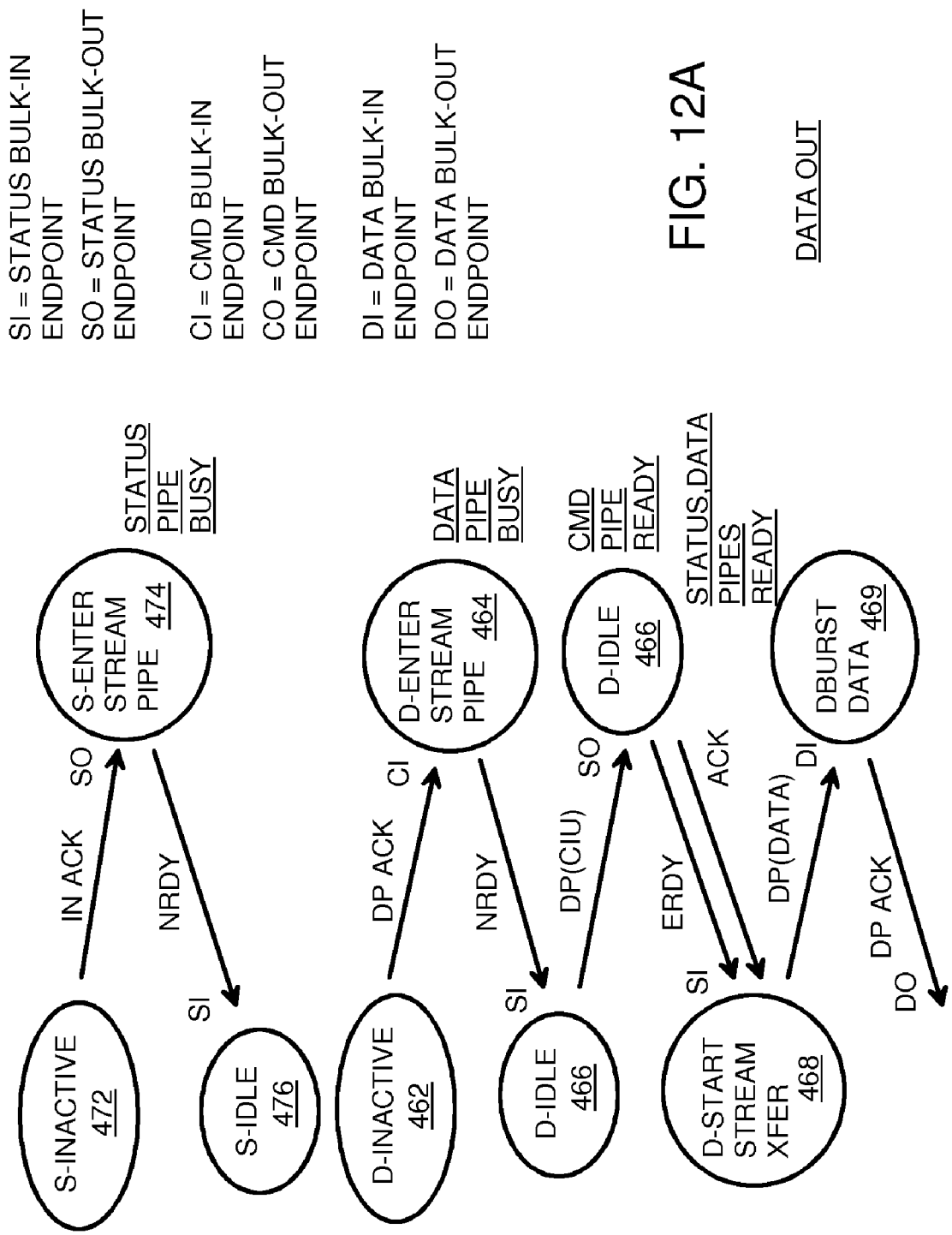

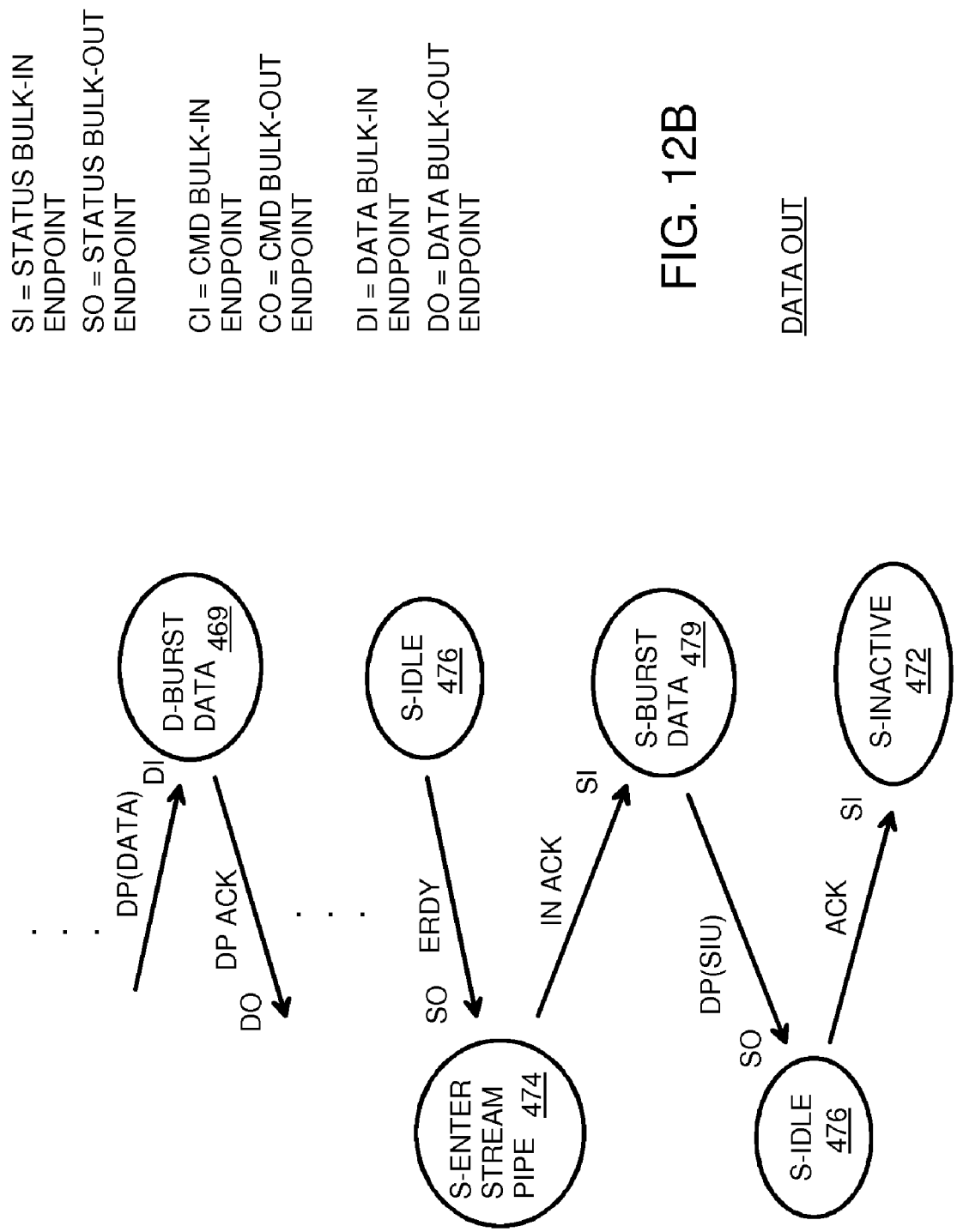

LOW-POWER USB FLASH CARD READER USING BULK-PIPE STREAMING WITH UAS COMMAND RE-ORDERING AND CHANNEL SEPARATION

RELATED APPLICATION

This application is a continuation-in-part of the co-pending application for "PCI EXPRESS-COMPATIBLE CONTROLLER AND INTERFACE FOR FLASH MEMORY", U.S. Ser. No. 12/254,428, filed on Oct. 20, 2008, which is a Division of "PCI EXPRESS-COMPATIBLE CONTROLLER AND INTERFACE FOR FLASH MEMORY", U.S. application Ser. No. 10/803,597, filed on Mar. 17, 2004, now U.S. Pat. No. 7,457,897.

This application is also a CIP of the co-pending U.S. patent application for "Low-Power Extended USB Flash Device without Polling", U.S. application Ser. No. 11/925,933, filed on Oct. 27, 2007.

This application is a continuation-in-part (CIP) of co-pending U.S. Patent Application for "HIGH-LEVEL BRIDGE FROM PCIE TO EXTENDED USB" Ser. No. 11/926,636, filed on Oct. 29, 2007.

This application is also a CIP of co-pending U.S. patent application for "Chained DMA for Low-Power Extended USB Flash Device Without Polling", U.S. application Ser. No. 11/928,124, filed on Oct. 30, 2007.

This application is a CIP for "Swappable Sets of Partial-Mapping Tables in a Flash-Memory System With A Command Queue for Combining Flash Writes", Ser. No. 12/347,306, filed on Dec. 31, 2008.

This application is a CIP of "Flash-Memory System with Enhanced Smart-Storage Switch and Packed Meta-Data Cache for Mitigating Write Amplification by Delaying and Merging Writes until a Host Read" U.S. application Ser. No. 12/576,216, filed on Oct. 8, 2009.

This application is a CIP of "Extended USB Dual-Personality Card Reader" U.S. application Ser. No. 11/927,549, filed on Oct. 29, 2007.

This application is also a CIP of "Differential data transfer for flash memory card" U.S. application Ser. No. 12/608,842, filed on Oct. 29, 2009.

FIELD OF THE INVENTION

This invention relates to flash-memory card readers, and more particularly to low-power card readers using bulk pipe streaming.

BACKGROUND OF THE INVENTION

A wide variety of flash-memory-card standards have emerged, such as Compact Flash (CF), Memory Stick (MS), Multi-Media Card/Secure Digital (MMC/SD), and micro versions of SD. Since an end user may use any or all of these formats, card readers often have many slots to accommodate these different flash-card formats.

Peripheral devices such as a flash-memory card reader are often connected to a host such as a personal computer (PC) by an expansion or peripheral bus such as Universal-Serial-Bus (USB). Such peripherals may plug directly into a USB socket on the host, or may have a cable with a plug that fits into the host's USB connector socket.

Newer versions of peripheral standards such as USB 3.0 offer higher speed transfers through faster clock rates, additional physical data lines, and more efficient framing and handshaking. Burst transfers may further improve throughput. Newer USB devices provide faster transfers when inserted into a host. The host may be able to detect USB devices and reduce throughput for these older devices when inserted into the more advanced host.

Some USB devices are embedded within the host system. The capacitance of the long USB cable is eliminated, replaced by a short cable, connector, or metal printed-circuit board (PCB) traces within the host, or even without a cable for directly plugging in.

Since memory on a USB device may be busy or slow, sometimes the host's request cannot be processed immediately. The host may send the request, then periodically poll the USB device to see whether the data is ready. Also, when the host is idle, the host may need to periodically poll the USB device to see if the USB device needs to transfer information to the host. This periodic polling may be used for other purposes as well, such as for polling a mouse for movement.

While polling is useful, since it allows the host to completely control the USB bus, power is consumed each time a packet is sent for polling. While this power is small, for low-power or battery-powered devices, the amount of power consumed may be significant and undesirable. Also, the USB device or host may otherwise be in a low-power sleep or suspend state, and have to wake up into a higher-power state to perform or respond to the polling. There may be significant time and energy required to wake up from the suspend or sleep state, and then to re-enter the suspend or sleep state once polling is done.

What is desired is a low-power card reader that can be accessed by a high-speed host. It is desirable to reduce power consumption for low-power USB devices that are accessed by the card reader.

BRIEF DESCRIPTION OF THE DRAWINGS

FIG. 1A shows a card reader connected to a host.

FIG. 1B shows an embedded card reader.

FIG. 2 highlights endpoints and pipes in a card reader.

FIGS. 12A-D show examples of state transitions in the status and data streaming state machines as data and status are streamed to and from the card reader.

DETAILED DESCRIPTION

Figure 3:
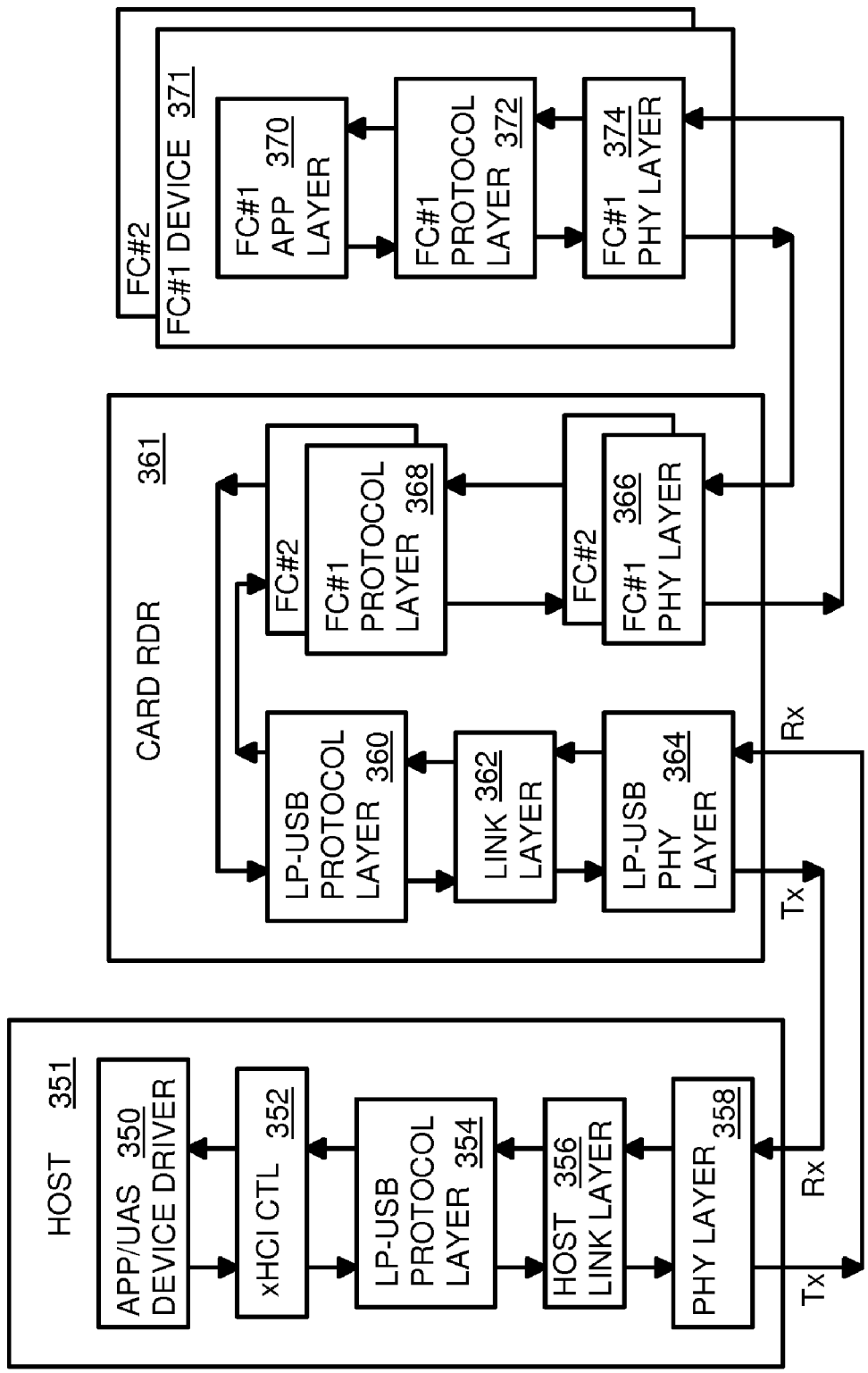
FIG. 3 is a protocol layer diagram of a card reader between a host and flash cards.

The present invention relates to an improvement in flash card readers. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

FIG. 1A shows a card reader connected to a host. Card reader 332 has slots that flash-memory cards of different formats fit into. These formats may include xD, MMC, SD, uSD, Memory Stick, and Compact Flash. USB sockets may also be present when card reader 332 also includes a USB hub. Flash memory on USB pen drives may also be accessed through the USB sockets. Indicator lights or displays may also be present on card reader 332.

Card reader 332 connects to PC host 330 by a USB cable that plugs into a standard USB socket on host 320. USB 3.0 rather than USB 2.0 is used when available on host 330, since USB 3.0 has about a 60% reduction in power while often operating at five times the speed of USB 2.0. Card reader 332 contains logic to support USB 3.0 and transfer data at the higher USB 3.0 speeds.

FIG. 1B shows an embedded card reader. Card reader 332 can be embedded with host 330. The slots for flash cards are located on the front of the host chassis to allow easy access by a user. Card reader 332 may have its control electronics on a separate printed-circuit board (PCB) than the main motherboard of host 330, or card reader 332 may have its logic integrated onto the same motherboard as host 330. Cables can connect the controller and buffer chip of card reader 332 to card connecters in the exposed slots on the host chassis.

FIG. 2 highlights endpoints and pipes in a card reader. The host and the card reader can communicate using USB-Attached-SCSI (UAS) as a higher level protocol on top of USB. The host PC is the UAS initiator and the card reader is the UAS target. Logical flow pipes are set up between the host and card reader to control the flow of USB packets through buffers in memory on the host and on the card reader. These pipes are logical pipes set up by software. However, the endpoints are physical registers on the target device that are written with the packet data. For Bulk endpoints, the data length can be 1024 bytes.

USB in Attached SCSI (UAS) mode is used for efficiency. Both the pipes and the endpoints are for bulk mode, except for the control pipe, which receives control information from the host for initialization of endpoints associated with UAS transfer. Command bulk-in endpoint 344 receives command transactions from the host that were sent through the bulk-out data pipe. Command bulk-out endpoint 346 on the target device sends commands to the host through the bulk-in status pipe or the bulk-in data pipe. These commands are sent as separate transactions.

Data and status are sent as part of a continuous stream, rather than as separate transactions. Using streaming increases throughput by reducing the overhead of separate transactions, since one the stream is set up, data can be sent without repeated sending transaction overhead information and performing handshaking for each transaction.

Two stream state machines are used. Data in/out streaming state machine 338 includes the data endpoints data bulk-out endpoint 334 and data bulk-in endpoint 336. Data is streamed from the host, through the bulk data-out pipe to data bulk-out endpoint 334, for writing to flash memory, and data is streamed to the host from data bulk-in endpoint 336 and through the bulk data-in pipe. Data that would be divided into many transactions are combined in the data streams with reduced overhead.

Status is sent from the card reader back to the host as host data is sent to the card reader for writing into the flash memory cards, and status is also sent from the host back to the card reader as data read from the flash memory cards is sent to the host.

Status streaming state machine 340 includes the status endpoints: status bulk-out endpoint 348 and status bulk-in endpoint 342. Status messages are streamed from status bulk-out endpoint 348 on the card reader, through the bulk-in status pipe to the host. Status messages are streamed from the host, through the bulk-out command pipe to status bulk-in endpoint 342. Status and commands can be combined in a single transaction packet using USB 3.0.

If only USB 2.0 is supported by the USB cable or host, then status messages from status bulk-in endpoint 342 are sent through the bulk data-in pipe rather than the bulk-in status pipe. Also, status messages and commands from the host are sent through the bulk data-in pipe to status bulk-out endpoint 348 and command bulk-out endpoint 346 for USB 2.0 mode.

FIG. 3 is a protocol layer diagram of a card reader between a host and flash cards. Card reader 361 has slots for flash cards 317 and responds to commands from host 351. Host 315 has applications that read and write flash data using UAS device drivers 350. Host controller interface 352 acts as a UAS initiator, using low-power USB protocol layer 354 to carry the UAS data in USB packets. Host link layer 356 verifies transmission of USB packets using checksums, while physical layer 358 drives the USB packets over the transmit Tx pair and receives USB packets from the receiver Rx pair.

Low-power USB physical layer 364 on card reader 361 passes received USB packets up to link layer 362 for checksum checking, and performs physical framing and physical signaling on the transmit and receiver pair from host 351. Low-power USB protocol layer 360 extracts the UAS commands and translates these commands into flash commands using flash-card protocol layer 368 for each flash card 371. Flash cards can operate in parallel with each other, so each flash card 371 has its own flash-card protocol layer 368 and flash-card physical layer 366.

Each flash card 371 is plugged into a slot on card reader 361. Flash-card physical layer 374 receives flash commands and transfers flash data. Flash-card protocol layer 372 decodes these flash commands and extracts the address and buffers the flash data. Flash card application layer 370 is activated to perform the flash reads and writes and erasing operations. These operations may require many clock cycles to perform.

Figure 4:
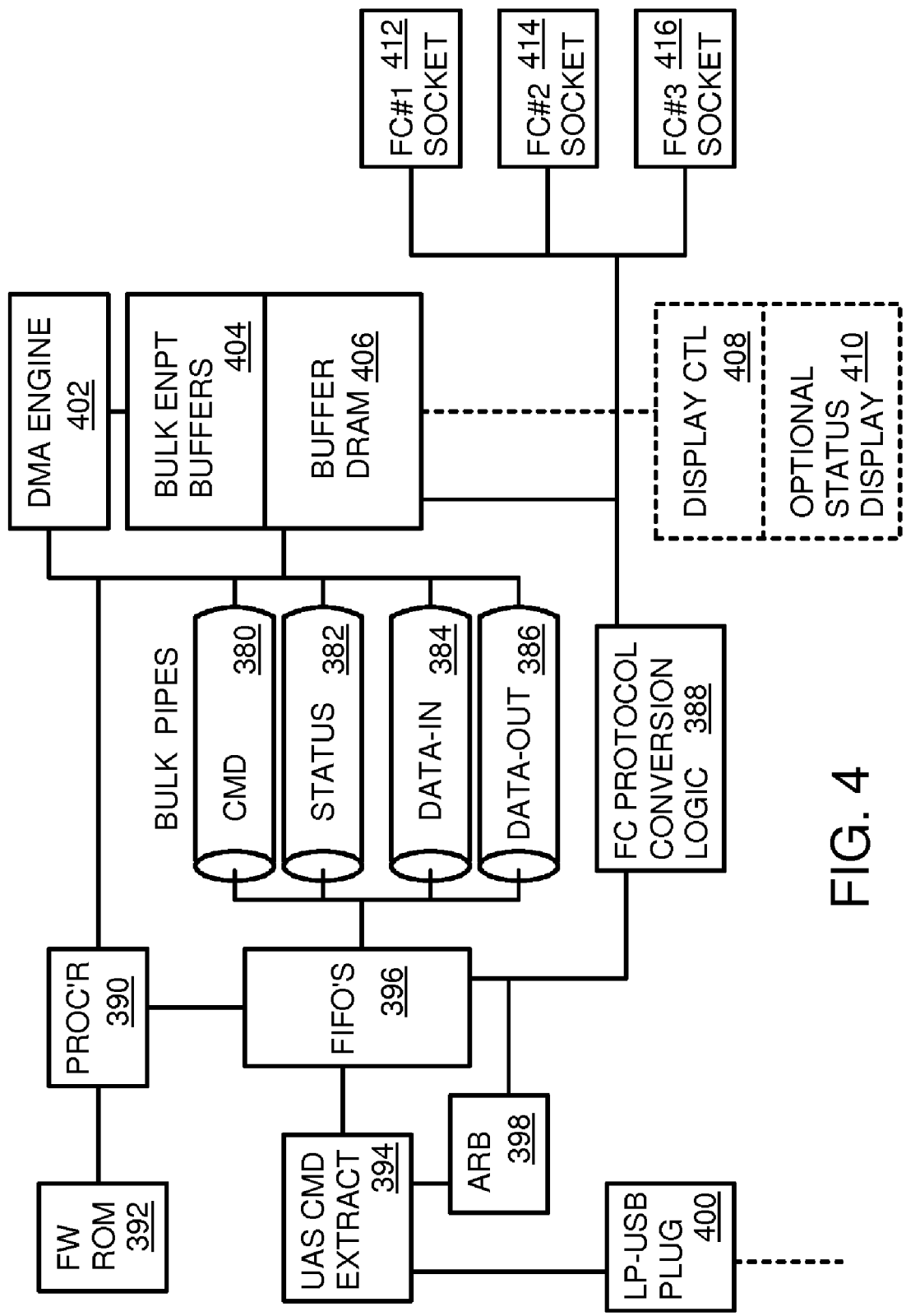
FIG. 4 is a diagram of a low-power card reader.

FIG. 4 is a diagram of a low-power card reader. Low-power USB plug 400 is for a USB cable that plugs into a host. UAS command extractor 394 extracts the UAS commands from the USB packets and loads headers and payloads into FIFOs 396 for the logical bulk pipes. The logical flow pipes include command pipe 380, status pipe 382, data-in pipe 384, and data-out pipe 386. All are bulk-mode pipes.

The endpoints of the streams that flow through these logical pipes are physical registers in bulk endpoint registers 404.

These can be separate registers or can be memory locations in buffer DRAM 406. Processor 390 executes routines in firmware read-only memory (ROM) 292 to program direct-memory access (DMA) engine 402 to transfer payload and headers through the bulk pipes between FIFOs 396 (the host initiator side of the pipes) and buffer DRAM 406 (the target side of the pipes).

Arbiter 398 searches addresses in FIFOs 396 for matches that indicate conflicts. These address conflicts must be processed in a specific order according to ordering rules. Flash-card protocol conversion logic 388 converts UAS commands into flash commands and activates the flash cards in flash sockets 412, 414, 416 to accept addresses and data from the endpoints in buffer DRAM 406.

An optional status display 410 can be driven by display controller 408 from display data in buffer DRAM 406.

Figure 5:
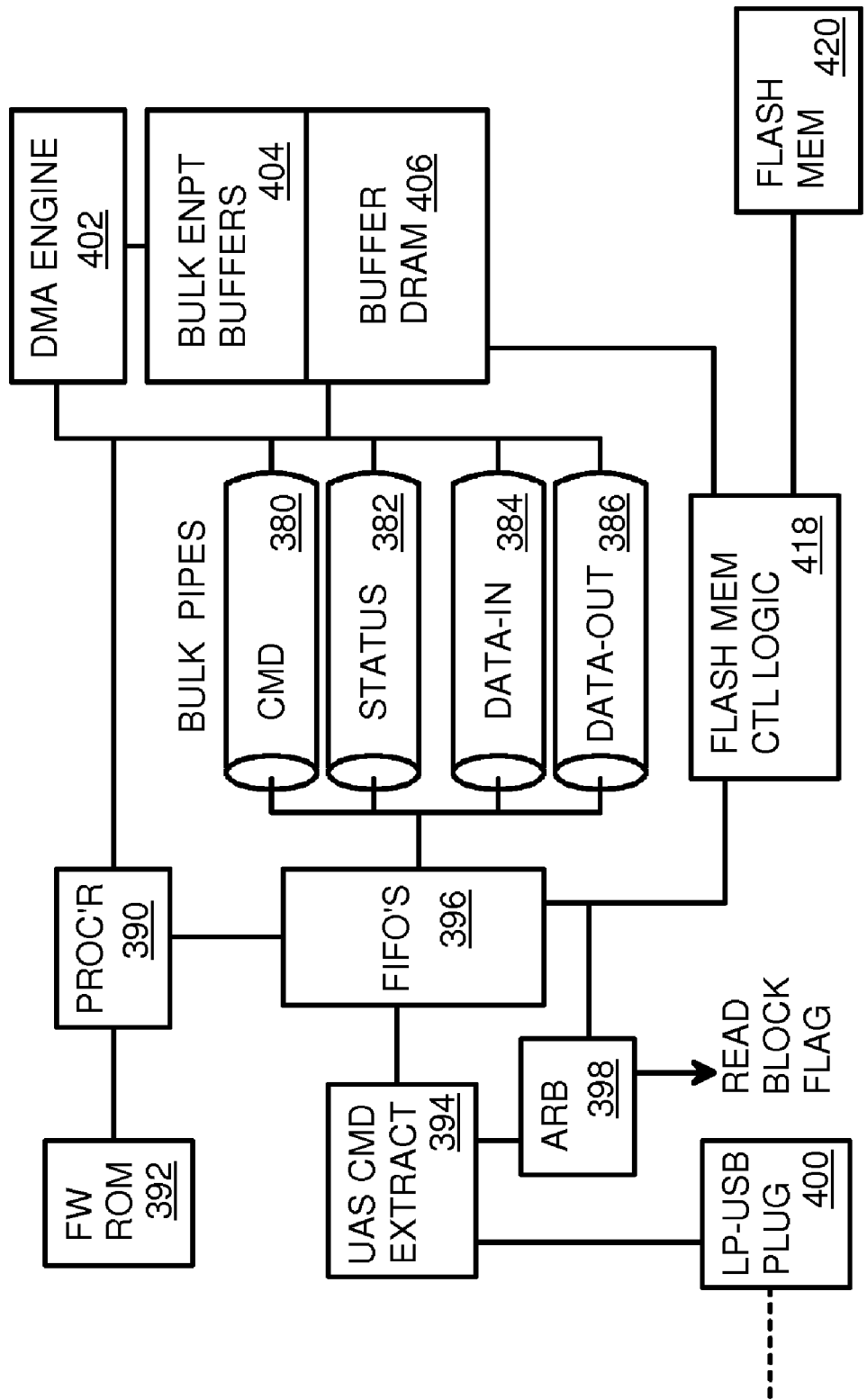
FIG. 5 is a variation of the card reader with an installed flash memory.

FIG. 5 is a variation of the card reader with an installed flash memory. Arbiter 398 sets a bloc flag when an address match or hit is found to signal the conflict. Flash memory controller logic 418 drives flash memory 420 directly without a separate flash-card controller in flash memory 420, since flash memory 420 is integrated with the card reader in this embodiment. Other blocks operate as described for FIG. 4.

Figure 6:
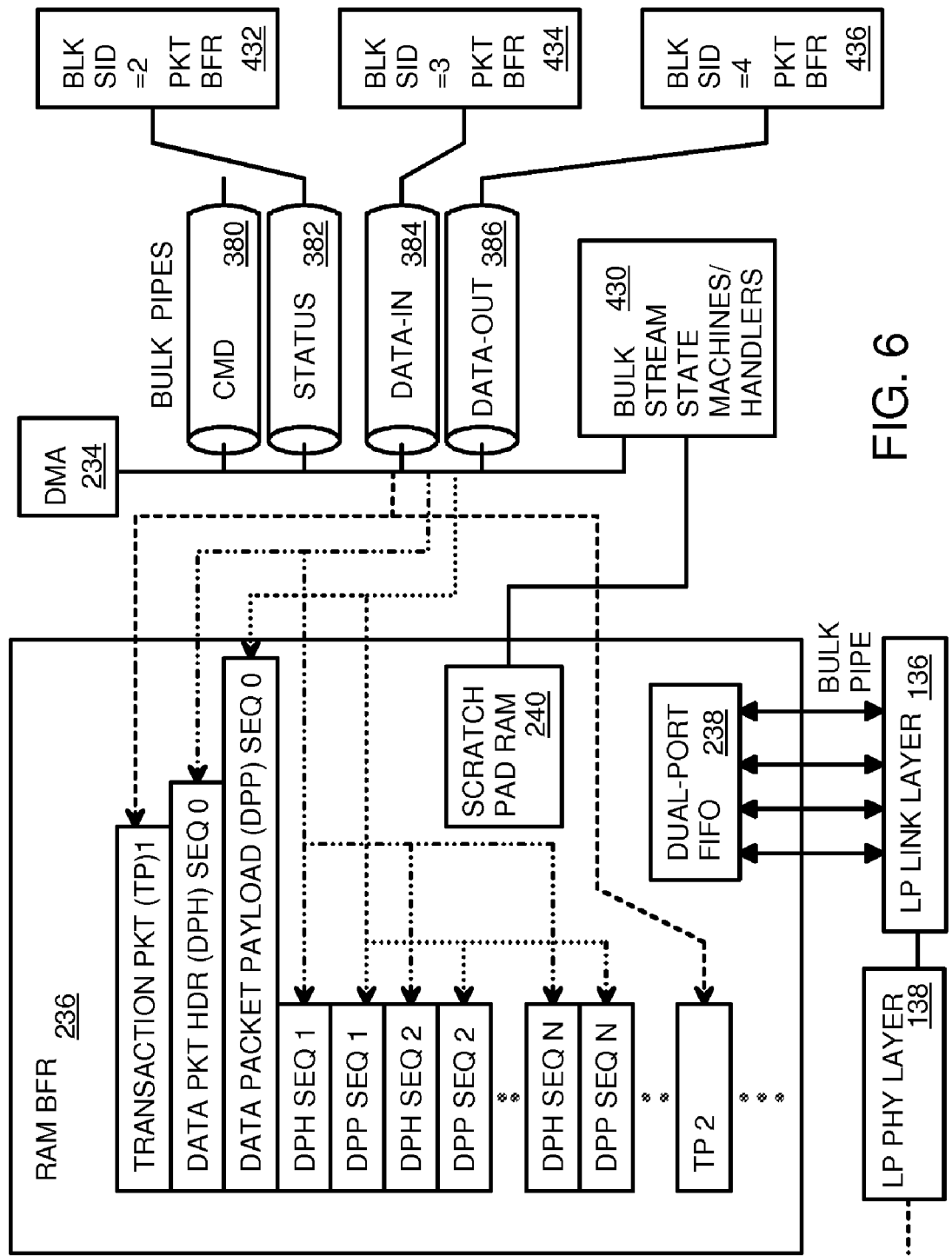
FIG. 6 highlights the operation of the protocol layer in the card reader.

FIG. 6 highlights the operation of the protocol layer in the card reader. A bulk pipe to low-power link layer 136 is created by dual-port FIFO 238, which can be part of RAM buffer 236. Scratch pad RAM 240 can be used by a flash memory control processor or for some other purpose. Low-power link layer 136 connects to the host through a USB cable driven by low-power physical layer 138.

Chaining direct-memory access (DMA) 234 stores pointers to headers and packets in RAM buffer 236 that are to be transmitted. For example, chaining DMA 234 points to transaction packet 1 (TP1), then to Data Packet Header (DPH) sequence 0, then to Data Packet Payload (DPP) sequence 0, then to DPH Seq 1, DPP Seq 1, DPH Seq 2, DPP Seq 2, etc. and then for all DPH and DPP in transaction packet 2. These packet headers and payloads are then transferred to dual-port FIFO 238 for transmission to Low-power link layer 136. A reverse DMA chaining occurs on the receive path.

DMA 234 sends the headers and payloads through the logical bulk pipes that include command pipe 380, status pipe 382, data-in pipe 384, and data-out pipe 386. All are bulk-mode pipes. DMA 234 arranges the data packets by Stream ID (SID) for each of the pipes. Each SID has its own packet buffer 432, 434, 436. These packet buffers correspond to the endpoints for the status, data-in, and data-out pipes. Bulk stream state machines and handlers 430 controls streaming of data headers and payloads through pipes 380, 382, 384, 386 to the endpoints arranged by stream ID.

Figure 7:
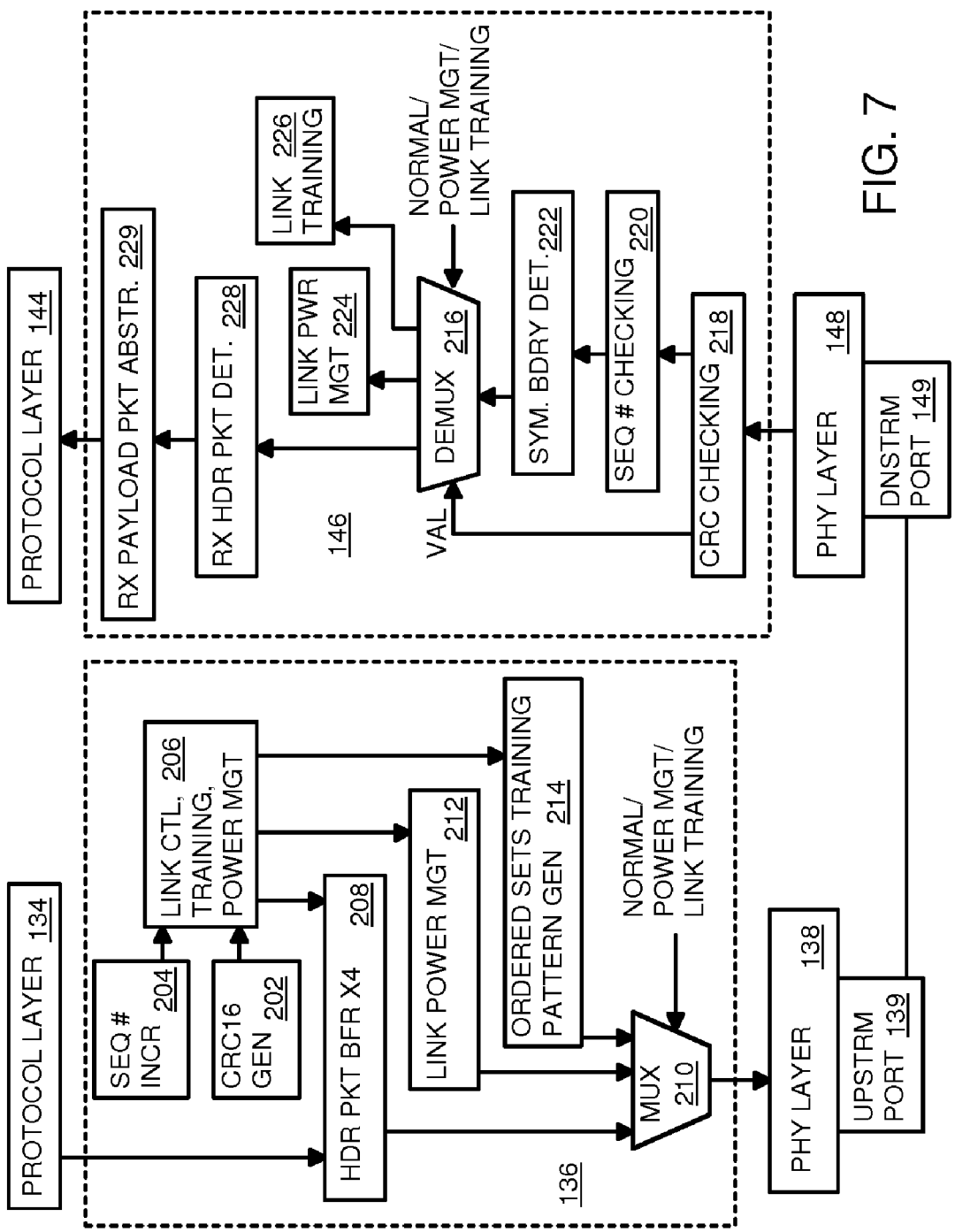
FIG. 7 highlights the low-power link layers.

FIG. 7 highlights the low-power link layers. Low-power link layer 136 is between protocol layer 134 and low-power physical layer 138 on the transmit path, while low-power link layer 146 is between protocol layer 144 and low-power physical layer 148 on the receive path. Upstream port 139 connects to the transmit Tx pair to the host while downstream port 149 connects to the receive Rx pair from the host.

Sequence number incrementer 204 and CRC16 generator 202 are in low-power link layer 136. Up to four header packets can be stored in header buffer 208. These headers can be modified by link controller 206, such as by setting and resetting bits in the headers in header buffer 208. These headers are selected by mux 210 during normal mode for transmission by low-power physical layer 138.

Link controller 206 also performs link training by activating ordered sets training pattern generator 214 to generate patterns for link training. These training patterns are transmitted when mux 210 is set to link training mode. Power management commands are generated by link power management 212 and selected by mux 210 for transmission during power management mode.

On the receiver side, CRC checker 218 checks incoming cyclical-redundancy-check (CRC) codes, while sequence number checker 220 checks sequence numbers. Symbol boundary detector 222 detects symbol boundaries, and valid symbols are sent through demux 216 to receive header packet detector 228 in normal mode, to link power manager 224 in power management mode, and to link training 226 in training mode. Payload data is abstracted by abstractor 229 once the header is detected and located. Abstractor 229 sends packets up to protocol layer 144.

Figure 8:
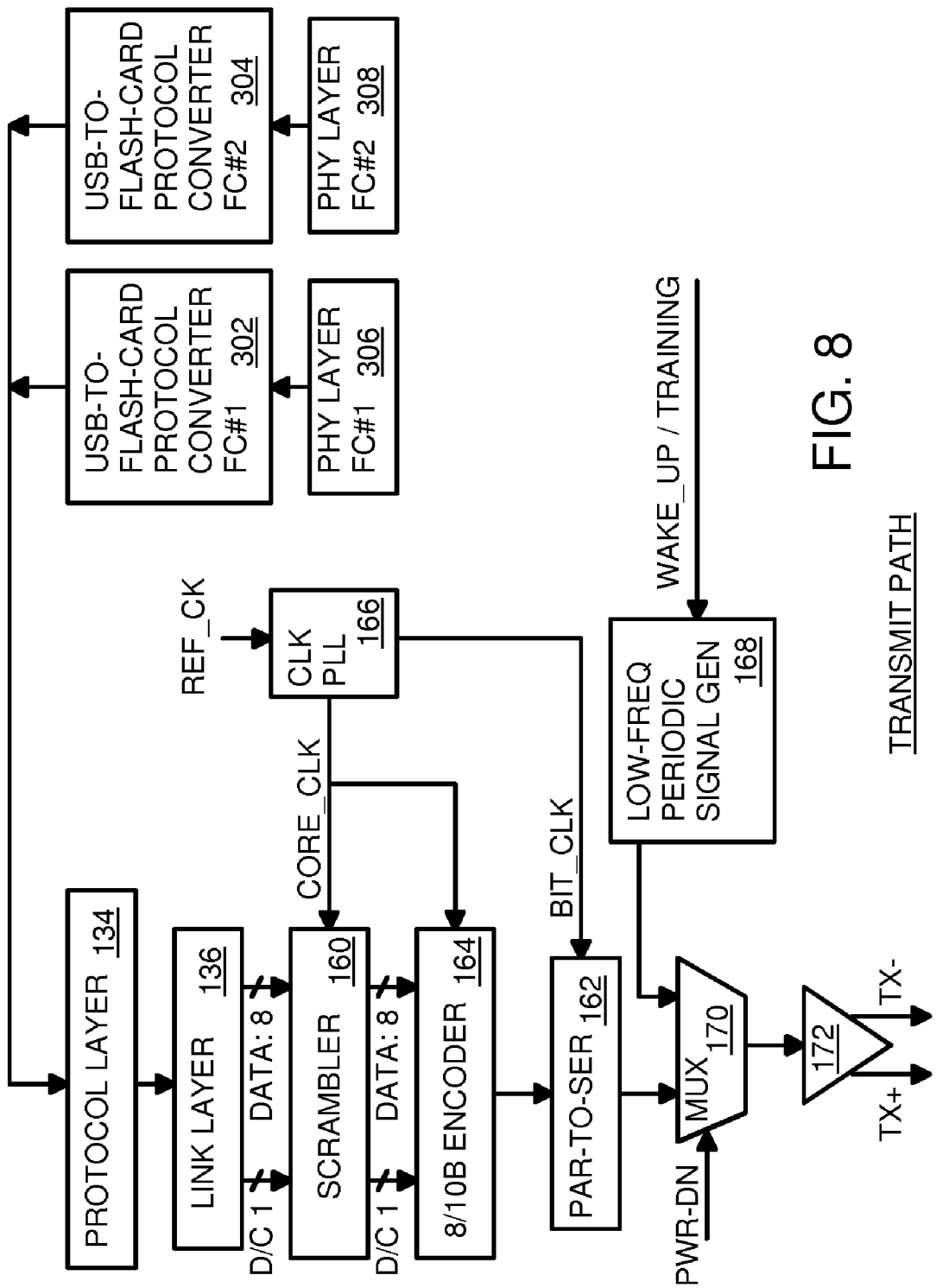
FIG. 8 highlights the transmit path of the low-power physical layer.

FIG. 8 highlights the transmit path of the low-power physical layer. On the card reader, protocol layer 134 receives flash data from USB-to-Flash-Card protocol converters 302, 304, which pack the flash data into USB commands. Each of converters 302, 304 connect to one of flash physical layers 306, 308. Separate converters and flash physical layers are provided for each flash card, allowing flash cards to be accessed in parallel.

Protocol layer 134 sends USB packets to link layer 136, which was shown in detail earlier in FIG. 7. Link layer 136 sends an 8-bit data byte and a 1-bit data/command flag to scrambler 160, which is used to smooth data to reduce EMI noise. Scrambler 160 sends scrambled data bytes and the D/C flag to 8/10 bit encoder 164, which encodes each data byte as a 10 bit data word for transmission. Phase-locked loop (PLL) 166 generates a core clock applied to scrambler 160 and to 8/10 bit encoder 164 from a reference clock. A bit clock from PLL 166 is applied to parallel-to-serial converter 162, which converts the data word to serial binary data.

The 10-bit data words are applied to mux 170. Mux 170 passes the data stream to line driver 172 when power-down mode is not active. When power down mode is active, signal generator 168 generates a low-frequency periodic signal or heartbeat that is sent through mux 170 to the Tx pair. This low-frequency signal has a fixed pattern with a lower-than-normal clock period. This low-frequency signal is used for various special purposes, such as wake up, entering or exiting a training sequence, or other purposes with a pre-defined meaning.

Figure 9:
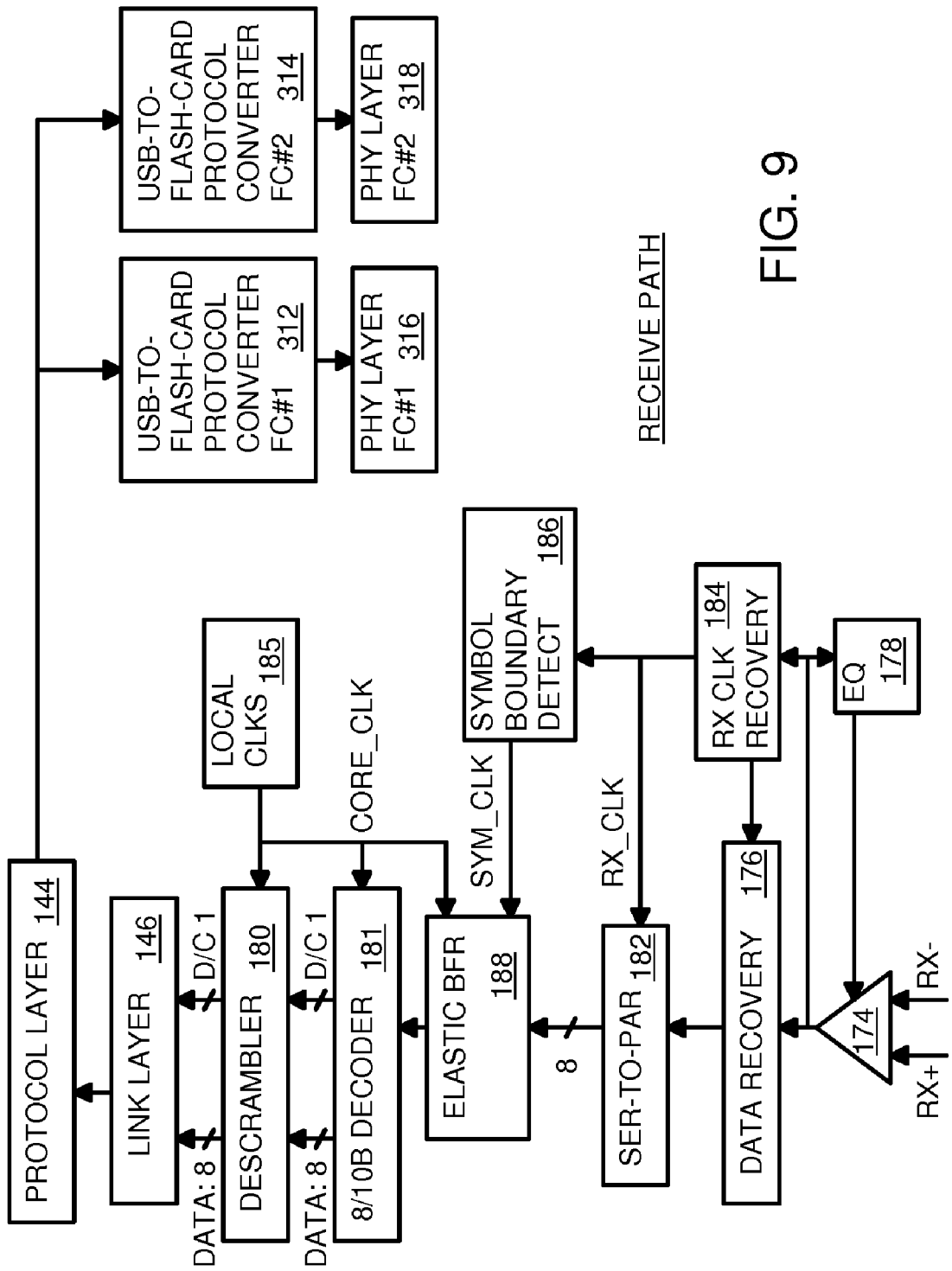
FIG. 9 highlights the receive path of the low-power physical layer.

FIG. 9 highlights the receive path of the low-power physical layer. The receive Rx pair is received by line receiver 174. The received data is encoded with the clock as data. Data recovery 176 examines the received data and signals when a sync pattern is detected, and when serial data is detected. These sync patterns do not occur in normal data. The serial data is then passed to serial-to-parallel converter 182.

Clock recovery 184 generates a receive clock from the data stream using equalizer 178 and outputs a receive clock RX_CLK. This receive clock is applied to serial-to-parallel converter 182 which generates 8-bit parallel data words. These data words are stored in elastic buffer 188 and then sent to 8/10-bit decoder 181 which converts the 10-bit data words into 8 bit data bytes and a 1 bit D/C flag. Descrambler 180 descrambles the data bytes and sends then to low-power link layer 146 as 8-bit data and one data/command bit. A core clock from local clock generator 185 clocks descrambler 180, /10-bit decoder 181, and low-power link layer 146.

A symbol clock is generated from the receive clock by aligner 186. Aligner 186 detects symbol boundaries, sync patterns, and control codes in the data stream using a high-frequency receive clock and a lower frequency symbol clock, and clocks words out of elastic buffer 188.

Low-power link layer 146 sends USB packets to protocol layer 144, which sends addresses, data, and commands to USB-to-Flash-Card protocol converters 312, 314. USB-to-Flash-Card protocol converters 312, 314, extract host data from the USB packets and sends the flash data with flash commands to flash physical layers 316, 318

Each of converters 312, 314 connect to one of flash physical layers 316, 318. Separate converters and flash physical layers are provided for each flash card, allowing flash cards to be written in parallel.

Figure 10:
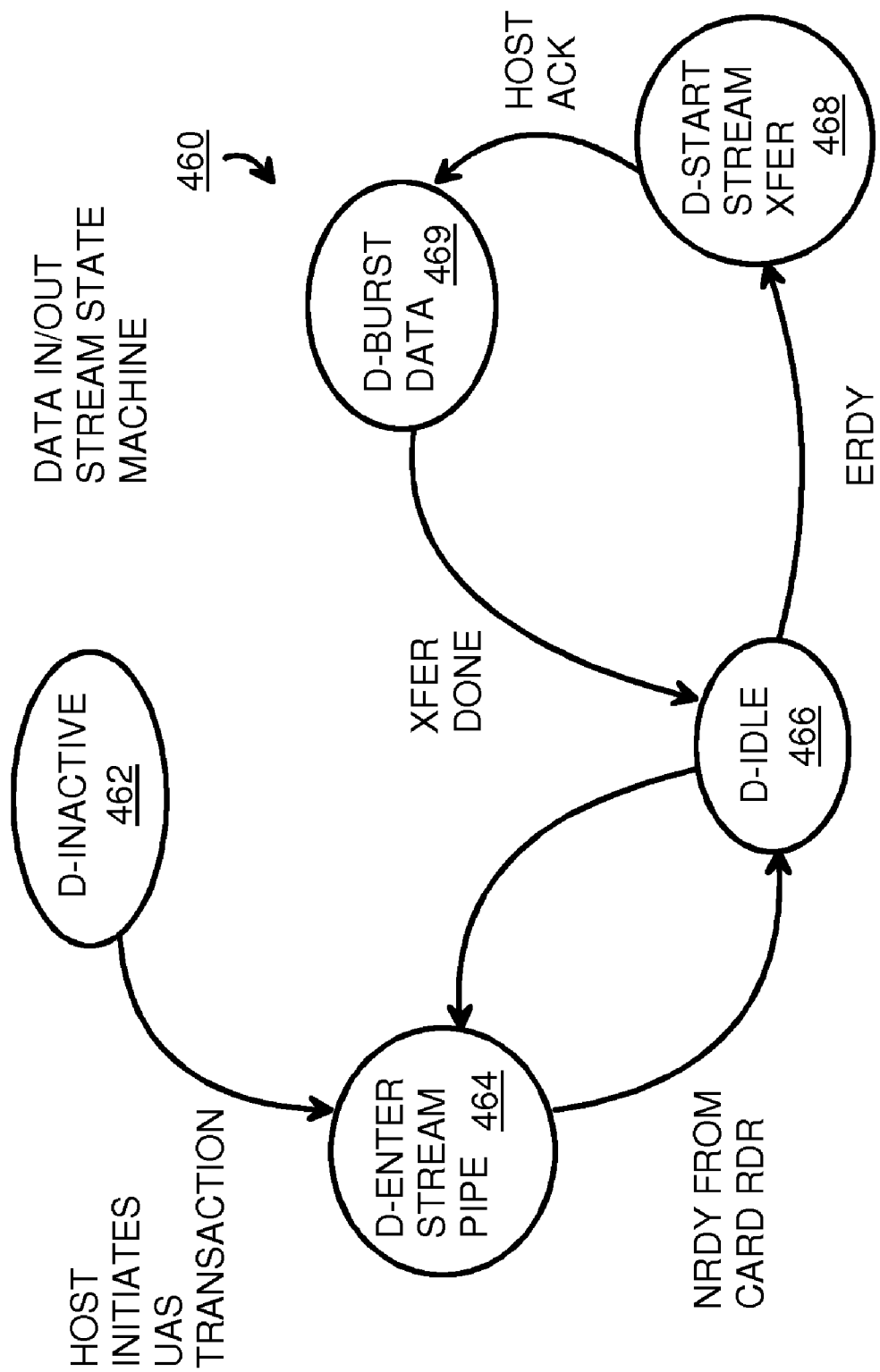
FIG. 10 is a diagram of a data streaming state machine.

FIG. 10 is a diagram of a data streaming state machine. Data in/out streaming state machine 460 is used to stream data through a pipe such as bulk data-out pipe 386 or bulk data-in pipe 384 (FIG. 6).

When the host initiates a UAS transaction, D-Inactive state 462 is exited and D-Enter state 464 is entered to stream data through either bulk data-out pipe 386 or bulk data-in pipe 384. When the card reader returns the not ready NRDY to the host, D-Idle state 466 is entered. When the card reader is ready to receive data from the host, the card reader responds with the ERDY signal and D-Start state 468 is entered to start the data stream transfer. The host sends an acknowledgement and begins to burst data across the USB link to the card reader, using D-Burst state 469. Data bursting continues until the transfer is done, and D-Idle state 466 is again entered. The card reader then waits for the host to send more data packets using this data stream. These data packets can be for other commands without creating new transactions with the card reader. Thus the overhead for setting up new transactions is reduced using data streaming.

Figure 11:
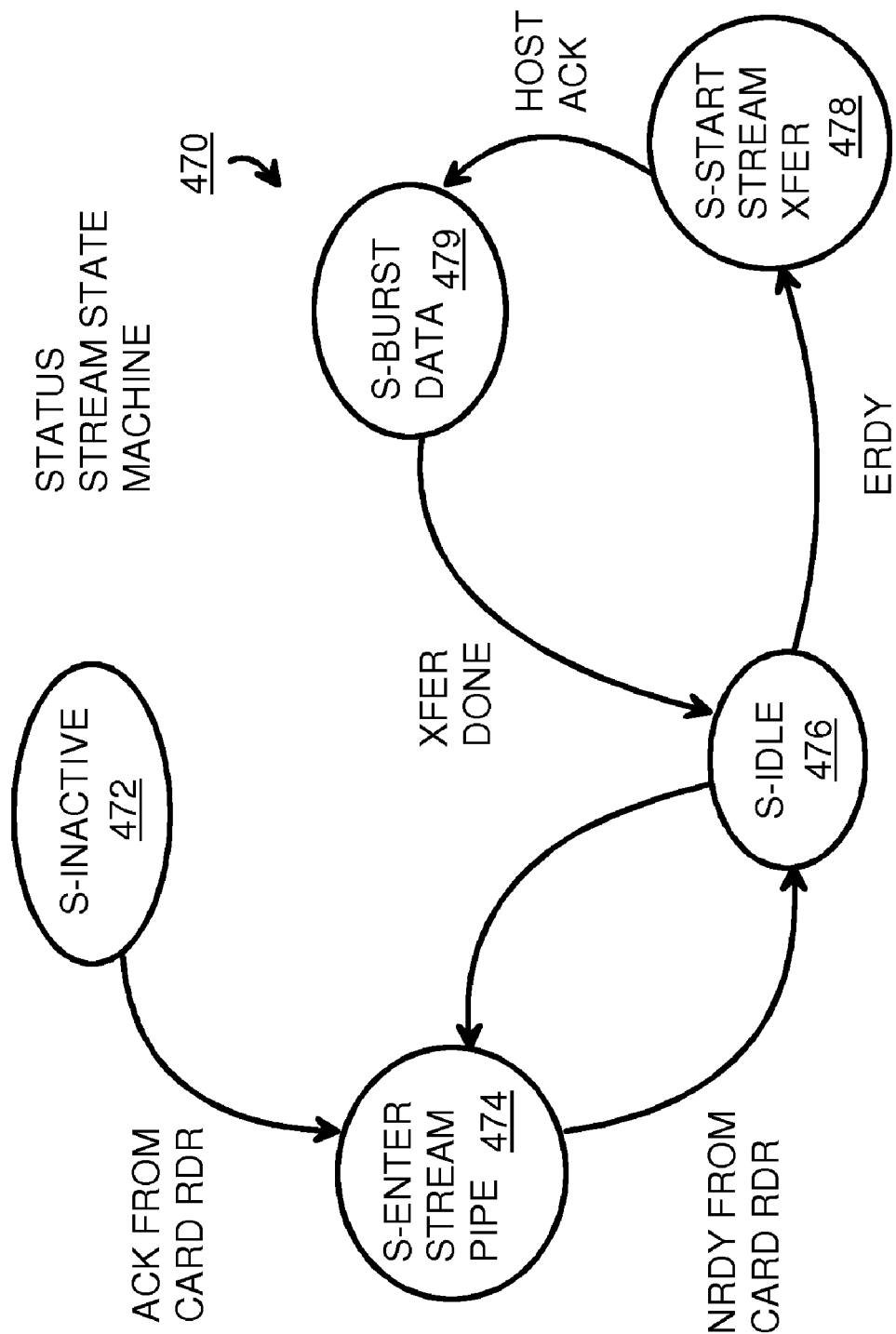
FIG. 11 is a diagram of a status streaming state machine.

FIG. 11 is a diagram of a status streaming state machine. Status streaming state machine 470 is used to stream status messages through a pipe such as status pipe 382 (FIG. 6).

When the card reader needs to send an acknowledgement back to the host, 5-Inactive state 472 is exited and S-Enter state 474 is entered to stream status messages to the host through status pipe 382. When the card reader returns the not ready NRDY to the host, S-Idle state 476 is entered. When the card reader is ready to send status data to the host, the card reader responds with the ERDY signal and S-Start state 478 is entered to start the data stream transfer. The host sends an acknowledgement and begins to read burst data written onto the USB link by the card reader, using S-Burst state 479. Data bursting continues until the transfer is done, and S-Idle state 476 is again entered. The host then waits for the card reader to send more status packets using this data stream. These status packets can be in response to other commands without creating new transactions with the card reader. Thus the overhead for responding with status messages for new transactions is reduced using data streaming. Status streaming state machine 470 can be used for multiple status messages for multiple flash cards and in response to multiple commands from the host.

Figure 12C:
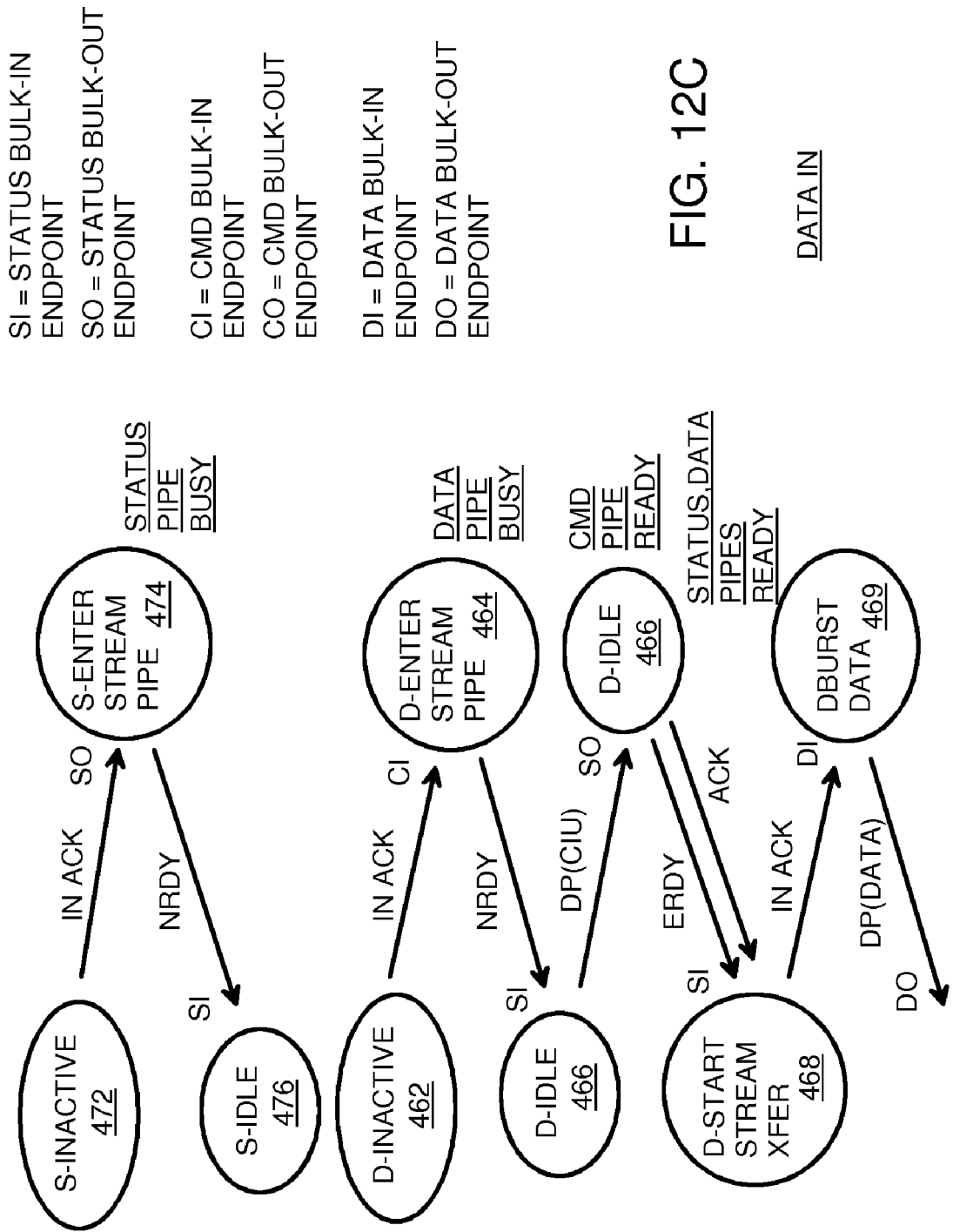

FIGS. 12A-D show examples of state transitions in the status and data streaming state machines as data and status are streamed to and from the card reader. In FIG. 12A, the host initiates a data-out transfer. The host sends an IN ACK packet to the card reader to check whether the status pipe is available. The host also sends out a UAS data-out acknowledgement in an ACK data packet DP ACK to check if the data pipe is available, and a CIU data packet with a command to determine if the command pipe is available. These 3 packets can be sent in any order.

To determine if the status pipe is available or busy, the host sends the UAS data-out command and acknowledgement IN ACK to status bulk-out endpoint 348 (FIG. 2) of the card reader to initiate the stream, causing status streaming state machine 470 to leave S-Inactive state 472 and enter S-Enter state 474. The status pipe is busy in this example, so the card reader initially responds with NRDY, which is sent from status bulk-in endpoint 342 (FIG. 2) to the host, causing S-Idle state 476 to be entered.

To determine if the data pipe is available or busy, the host sends the UAS data-out acknowledgement in an ACK data packet DP ACK to Command bulk-in endpoint 344 (CI) of the card reader. Data in/out streaming state machine 460 is initially in D-Inactive state 462 but transitions to D-Enter state 464 in response to the DP ACK data packet. The data pipe is busy in this example, so the card reader initially responds with NRDY, which is sent from status bulk-in endpoint 342 (SI) to the host, causing D-Idle state 466 to be entered.

To determine if the command pipe is available or busy, the host sends a CIU data packet with a command to the command bulk-in endpoint 344 (CI) of the card reader. The command pipe is available in this example, so the card reader responds with an ERDY signal in a packet sent to the host from SI status bulk-in endpoint 342. D-Start state 468 is entered. The data pipe also becomes available, so the card reader sends and ACK data packet to the host to indicate that the data pipe is now available.

The host uses the data pipe to send data packets to DI data bulk-in endpoint 336 of the card reader and D-Burst state 469 is entered. The card reader sends the host an acknowledgement status packet from SI status bulk-in endpoint 342 for each burst of data received. This can continue for multiple packets in a burst of data.

In FIG. 12B, the host continues to burst data to the card reader by sending packets through bulk data-out pipe 386 to DO data bulk-out endpoint 334, and the card reader each time responds with a status acknowledgement data packet (1K bytes) sent through data-out pipe 386 from its DO data bulk-out endpoint 334. After data bursting is totally completed, S-Idle state 476 is entered and the card reader sends an ERDY signal in a data packet to the host from SI status bulk-out endpoint 342 indicating that the status pipe is now available. Status pipe 382 is used and S-Enter state 474 is entered.

The host sends a IN ACK status packet to SO status bulk-out endpoint 348 of the card reader, causing status streaming state machine 470 to enter S-Burst state 479. Status packets can then be bursted from the host to the card reader through status pipe 382. The card reader responds to each status burst with a status SIU data packet to the host, sent from CO Command bulk-out endpoint 346 through command pipe 380. S-Idle state 476 is entered after the burst. The host sends an acknowledgement packet to SO status bulk-out endpoint 348 of the card reader through status pipe 382. S-Inactive state 472 is entered once the status transfer is completed, and status streaming state machine 470 waits, ready for the next status burst.

In FIG. 12C, the host initiates a data-in transfer. The host sends an IN ACK packet to the card reader to check whether the status pipe is available. The host also sends out an IN ACK data packet to check if the data pipe is available, and a CIU data packet with a command to determine if the command pipe is available. These 3 packets can be sent in any order.

To determine if the status pipe is available or busy, the host sends the UAS data-out command and acknowledgement IN ACK to status bulk-out endpoint 348 (FIG. 2) of the card reader to initiate the stream, causing status streaming state machine 470 to leave S-Inactive state 472 and enter S-Enter state 474. The status pipe is busy in this example, so the card reader initially responds with NRDY, which is sent from status bulk-in endpoint 342 (FIG. 2) to the host, causing S-Idle state 476 to be entered.

To determine if the data pipe is available or busy, the host sends an IN ACK data packet to Command bulk-in endpoint 344 (CI) of the card reader. Data in/out streaming state machine 460 is initially in D-Inactive state 462 but transitions to D-Enter state 464 in response to the IN ACK data packet. The data pipe is busy in this example, so the card reader initially responds with NRDY, which is sent from status bulk-in endpoint 342 (SI) to the host, causing D-Idle state 466 to be entered.

To determine if the command pipe is available or busy, the host sends a CIU data packet with a command to the command bulk-in endpoint 344 (CI) of the card reader. The command pipe is available in this example, so the card reader responds with an ERDY signal in a packet sent to the host from SI status bulk-in endpoint 342. D-Start state 468 is entered. The data pipe also becomes available, so the card reader sends and ACK data packet to the host to indicate that the data pipe is now available.

The host sends an IN ACK data packet to DO data bulk-out endpoint 334 of the card reader to instruct the card reader to burst data to the host. D-Burst state 469 is entered. The card reader uses the data pipe to send data packets from data bulk-in endpoint 336 to the host. This can continue for multiple packets in a burst of data.

Figure 12D:
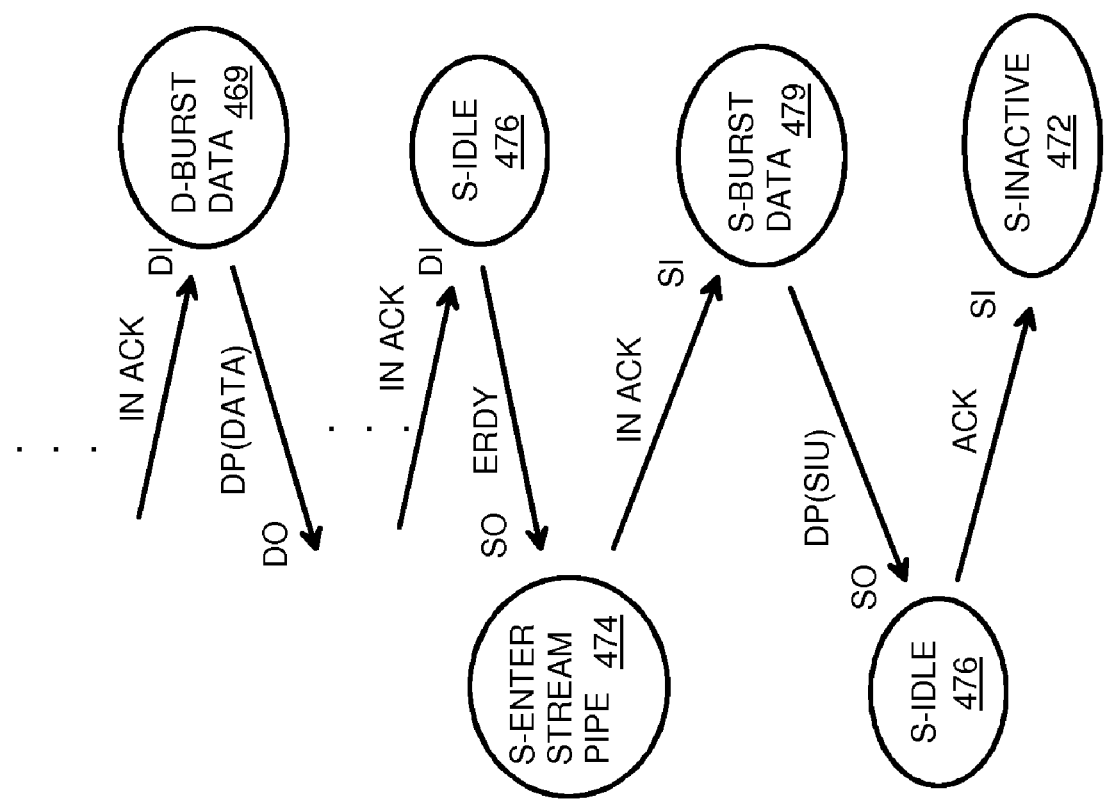

In FIG. 12D, the host continues to receive burst data from the card reader that sends packets through bulk data-in pipe 384 from DI data bulk-in endpoint 334, and the host each time responds with an acknowledgement data packet requesting more data. After data bursting is completed, S-Idle state 476 is entered and the card reader sends an ERDY signal in a data packet to the host from SI status bulk-in endpoint 342 indicating that the status pipe is now available. Status pipe 382 is used and S-Enter state 474 is entered.

The host sends a IN ACK status packet to SO status bulk-out endpoint 348 of the card reader, causing status streaming state machine 470 to enter S-Burst state 479. Status packets can then be bursted from the host to the card reader through status pipe 382. The card reader responds to each status burst with a status SIU data packet to the host, sent from CO Command bulk-out endpoint 346 through command pipe 380. S-Idle state 476 is entered after the burst. The host sends an acknowledgement packet to SO status bulk-out endpoint 348 of the card reader through status pipe 382. S-Inactive state 472 is entered once the status transfer is completed, and status streaming state machine 470 waits, ready for the next status burst.

Figure 13:
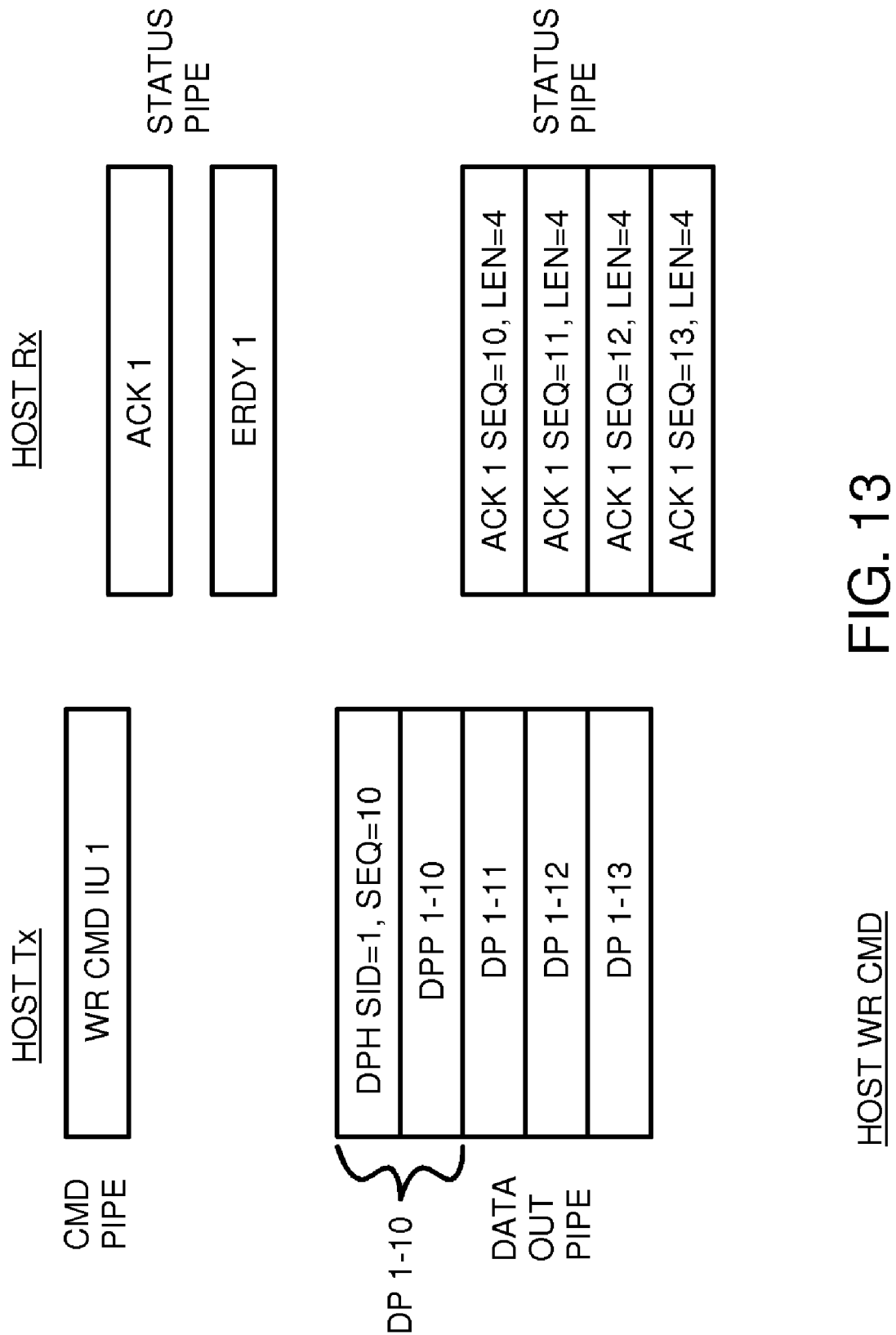
FIG. 13 shows pipes used for a host write command.

FIG. 13 shows pipes used for a host write command. The host transmits a write Command Information Unit (CIU) through the command pipe. The card reader sends the host an acknowledgement and an ERDY through the status pipe. These all have a stream ID of SID=1.

The host then bursts data to the card reader using the data-out pipe. A data packet header (DPH) for SID=1, sequence 10 is sent, followed by the data packet payload (DPP) for this data packet (DP). The card reader responds through the status pipe with an acknowledgement packet with the same SID and sequence numbers and the length of data received.

The host continues to send data packets through bulk data-out pipe 386 for other sequence numbers (11, 12, 13) in this SID and the card reader responds to each packet with an acknowledgement packet sent through status pipe 382.

Figure 14:
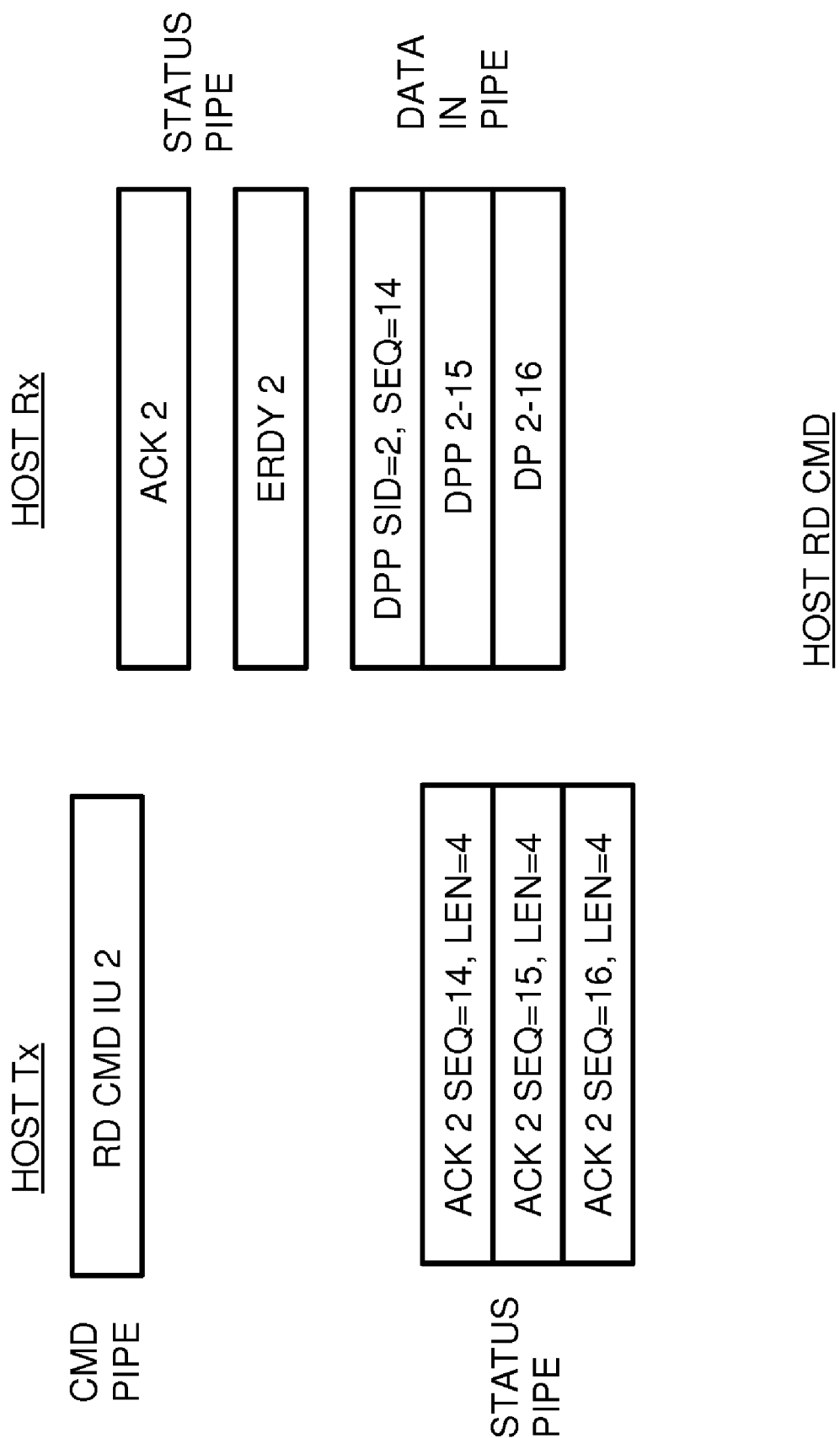
FIG. 14 shows pipes used for a host read command.

FIG. 14 shows pipes used for a host read command. The host transmits a read Command Information Unit (CIU) through the command pipe. The card reader sends the host an acknowledgement and an ERDY through the status pipe. These all have a stream ID of SID=2 in this example.

The card reader then bursts data to the host using the data-in pipe. A data packet (DP) for SID=2, sequence 14 is sent. The host responds through the status pipe with an acknowledgement packet with the same SID and sequence numbers and the length of data received.

The card reader continues to send data packets through bulk data-in pipe 384 for other sequence numbers (15, 16) in this SID and the host responds to each packet with an acknowledgement packet sent through status pipe 382.

Figure 15:
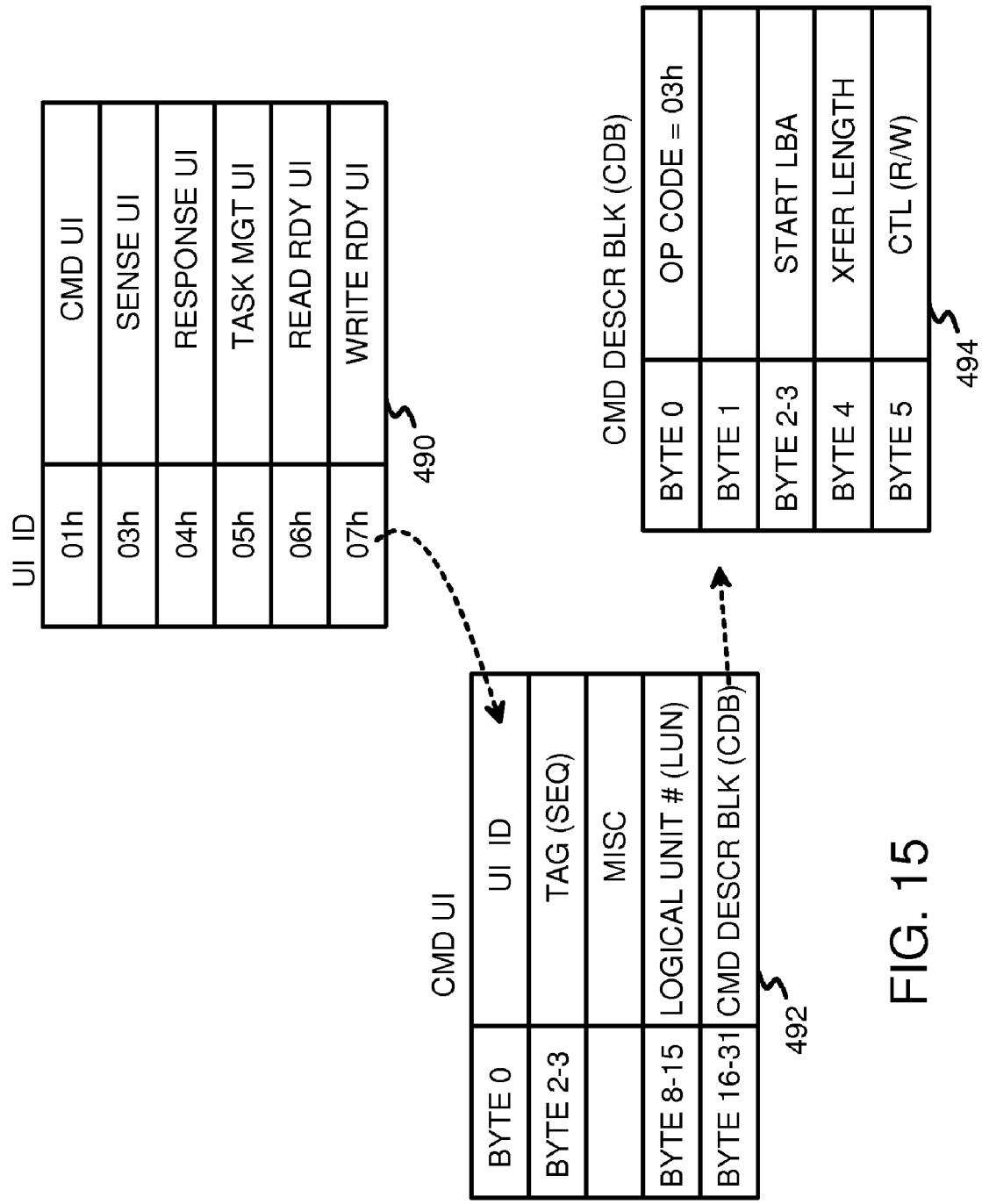
FIG. 15 shows UAS commands in more detail.

FIG. 15 shows UAS commands in more detail. Table 490 is a list of identifiers for Information Units (IU) using the UAS protocol. The IU ID from table 490 is a hex value that is the first byte in CIU 492. Other bytes in CIU 492 include a sequence tag, a logical unit number (LUN), and a Command Descriptor Block (CDB). CDB 494 includes an operation code, a starting logical block address (LBA), a transfer length, and a control byte that can indicate reading or writing.

Figure 16:
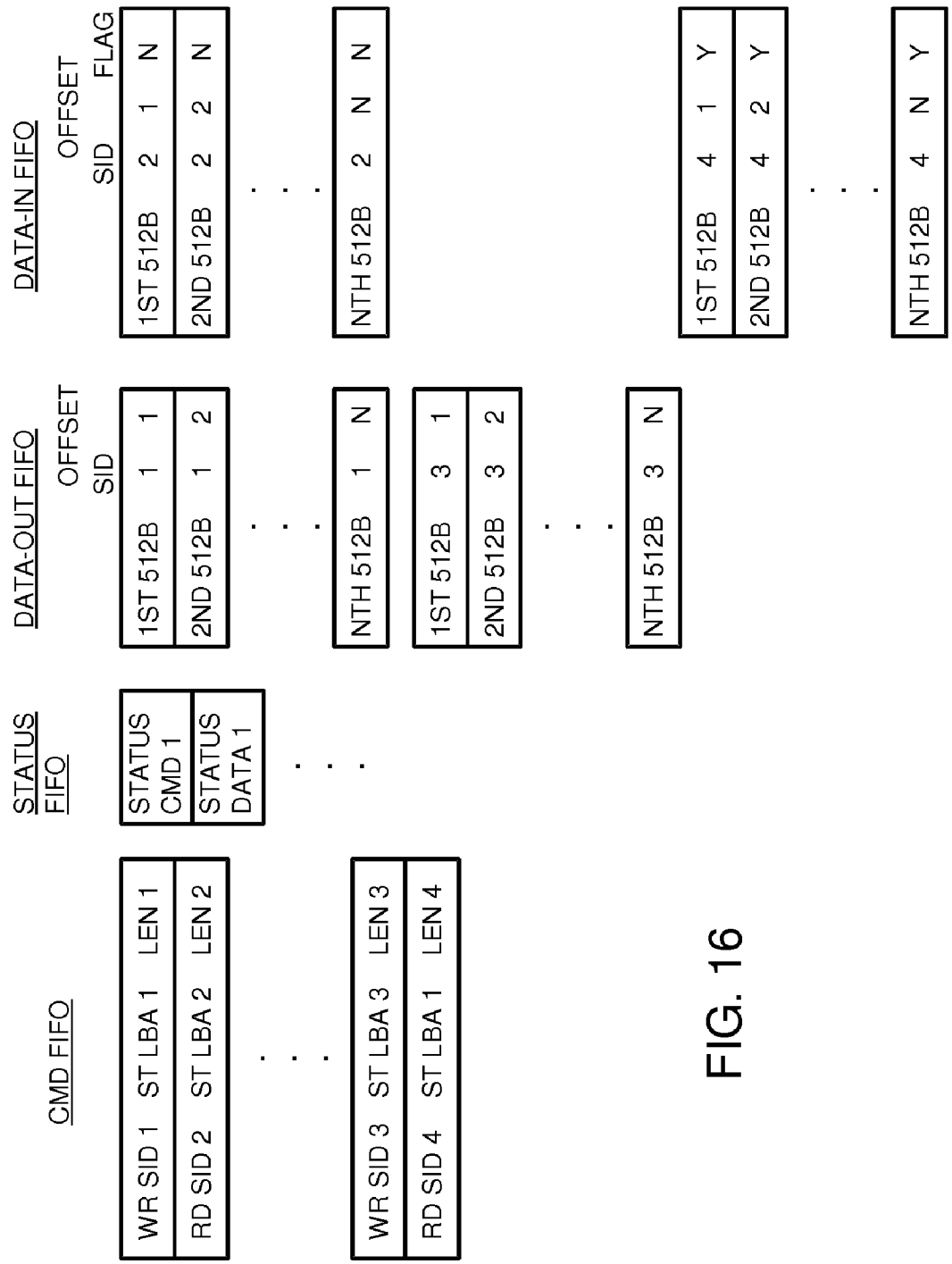
FIG. 16 shows the card reader processing CIU commands using parallel data channels.

FIG. 16 shows the card reader processing CIU commands using parallel data channels. Commands in command pipe 380 are loaded into a command FIFO. These commands include a host write labeled SID 1 at LBA=1 with a length of 1, a host read labeled SID 2 at LBA=2 with a length of 2, and other commands including a host write labeled SID 3 at LBA=3 with a length of 3, a host read labeled SID 4 at LBA=4 with a length of 4.

Status packets from the card reader are returned to the host using status pipe 382. The status packets are physically loaded into a status FIFO. Status packets are returned to the host from the card reader separately for both the command and for the data.

Host data for the first host write is loaded into the data-out FIFO when being sent through bulk data-out pipe 386. Each 512-byte block of data has a different offset value for the first host write command with SID 1. Likewise, other 512-byte blocks of data with offsets 1 to N are stored for the third host write command with SID=3.

Flash data from the card reader that is to be sent to the host for the first host read command is loaded into the data-in FIFO when being sent through bulk data-in pipe 384. Each 512-byte block of data has a different offset value for the first host read command with SID 2 Likewise, other 512-byte blocks of data with offsets 1 to N are stored for the fourth host write command with SID=4. A blocking flag is also stored in the data-in FIFO. This blocking flag is set when the address overlaps an address of an earlier command.

Having separate FIFO's for data-in and data-out pipes allows for parallel processing or write and read commands. Throughput is increased. Host reads can be processed ahead of host writes when the flash data is available.

Figure 17A:
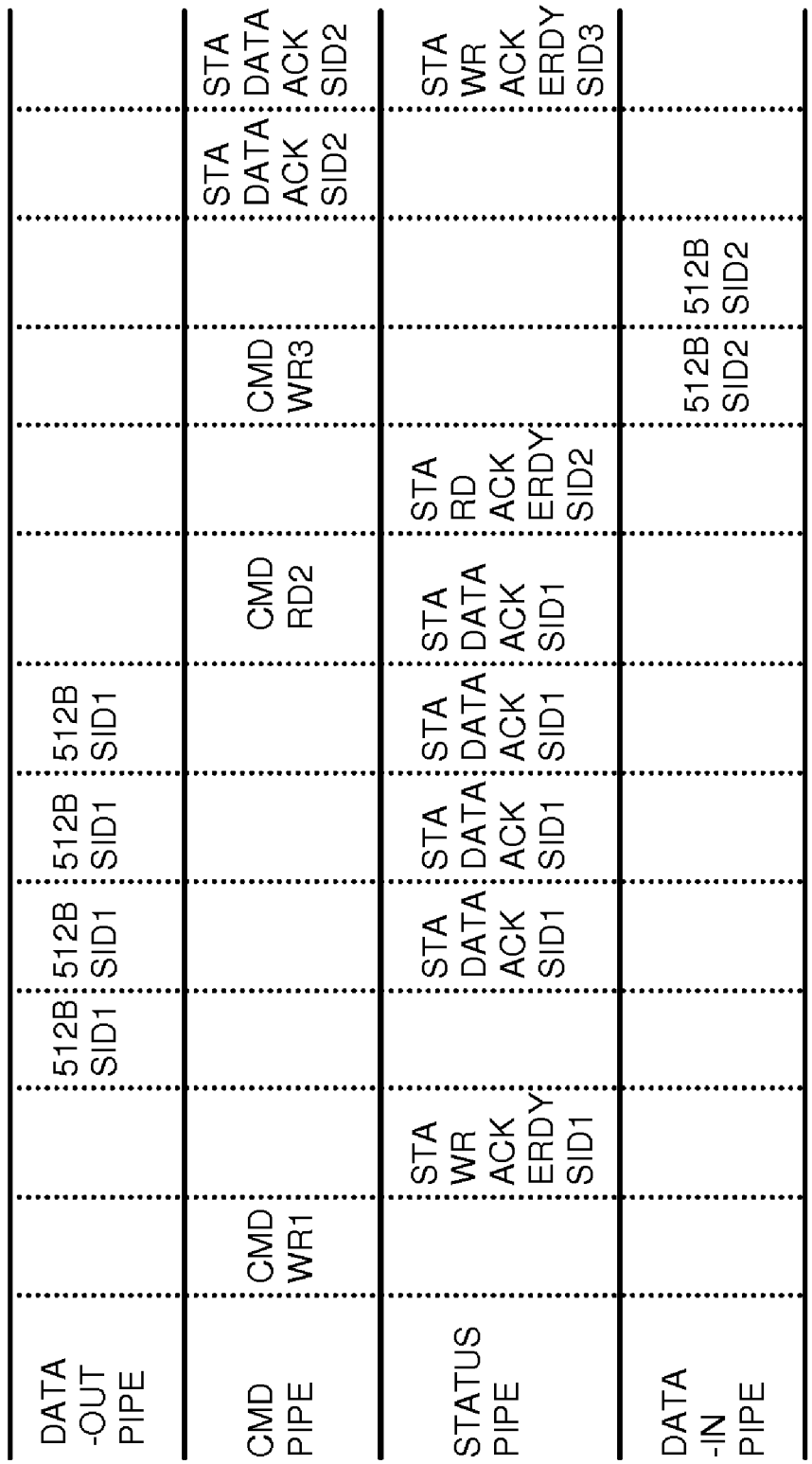
FIGS. 17A-B show timing relationships among packets in the four pipes.
Figure 17B:
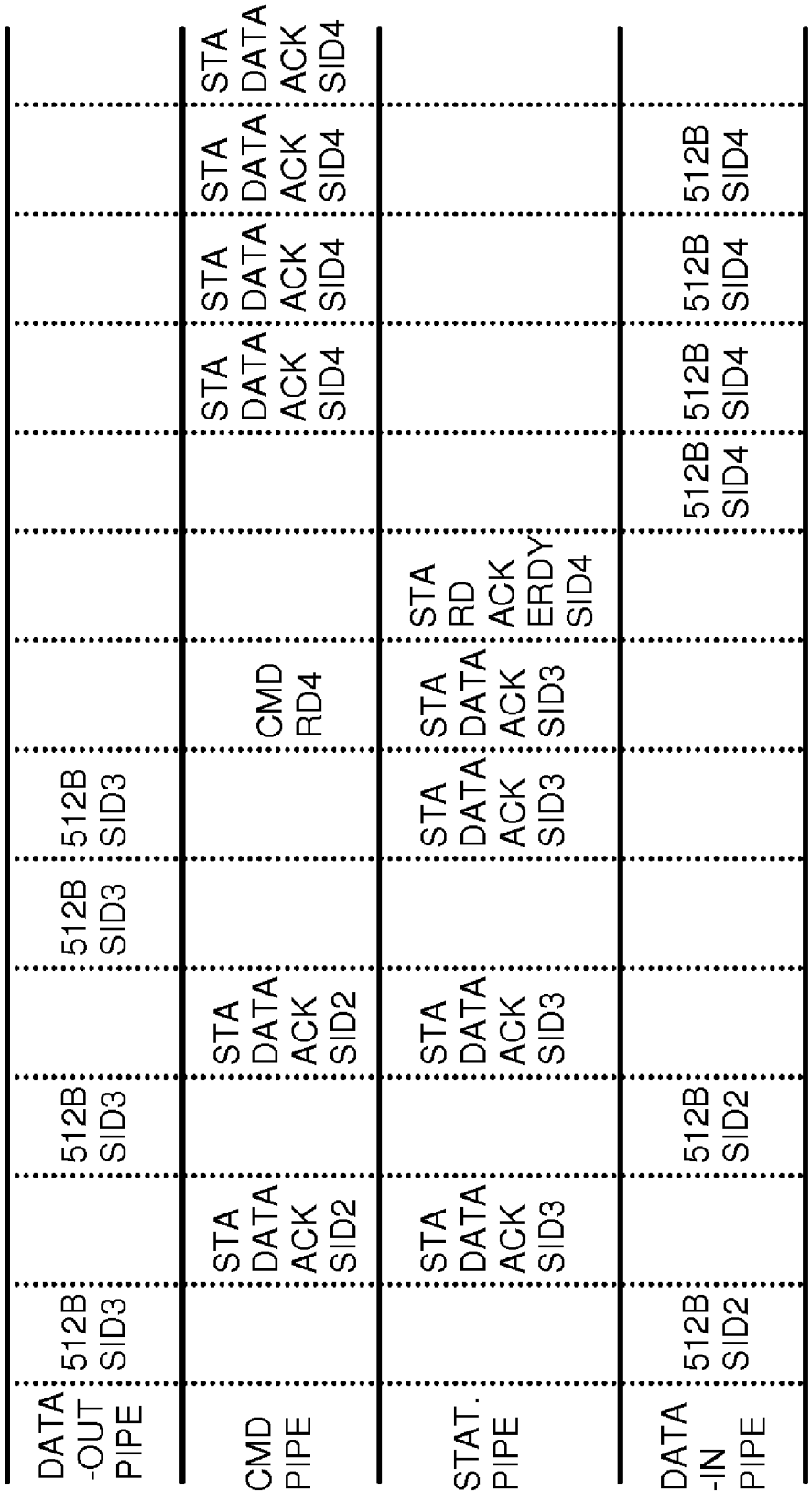

FIGS. 17A-B show timing relationships among packets in the four pipes. In FIG. 17A, the host sends a write command 1 through the command pipe to the card reader. The card reader replies with an acknowledgement and an ERDY packet sent through status pipe 382. The host then bursts four 512-byte blocks of data to the card reader through bulk data-out pipe 386. The card reader responds to each block of data with an acknowledgement status packet sent through status pipe 382.

Once all data is bursted from the host for write command 1, read command 2 can be sent through command pipe 380. The card reader replies with an acknowledgement and an ERDY packet sent through status pipe 382 for the read command with SID=2. The host then sends another write command with SID=3 through command pipe 380, and the card reader replies with an acknowledgement and an ERDY packet sent through status pipe 382 for the write command with SID=3. This acknowledgement is delayed by the card reader since the prior read command is still being processed. The card reader reads the flash memory or its cache and bursts the read data to the host through bulk data-in pipe 384. The host receives the read data bursts and replies to each 512-byte block with an acknowledgement for SID=2 through command pipe 380.

In FIG. 17B, the reading of the third and fourth 512-byte blocks for the second read continue with some delay. The host receives the delayed read data bursts and replies to each 512-byte block with an acknowledgement for SID=2 through command pipe 380. The host also bursts the write data for write command 3 to the card reader through bulk data-out pipe 386. Some of the data bursts are delayed by the host when the host needs to send acknowledgements for read data for SID=2 for the second read command. The card reader sends acknowledgements for each data block burst from the host as status packets in status pipe 382 with SID=3. These acknowledgement status packets are sent shortly after the data is received by the card reader.

Once all data is bursted from the host for write command 3, read command 4 can be sent through command pipe 380. The card reader replies with an acknowledgement and an ERDY packet sent through status pipe 382 for this read command with SID=4. The card reader reads the flash memory or its cache and bursts the read data to the host through bulk data-in pipe 384. The host receives the read data bursts and replies to each 512-byte block with an acknowledgement for SID=4 through command pipe 380.

Since there are separate pipes for data-in, data-out, status, and commands, the host and card reader can process packets from these four pipes in parallel, reducing delays due to blocking when a only single pipe is used. Throughput is increased.

Figure 18:
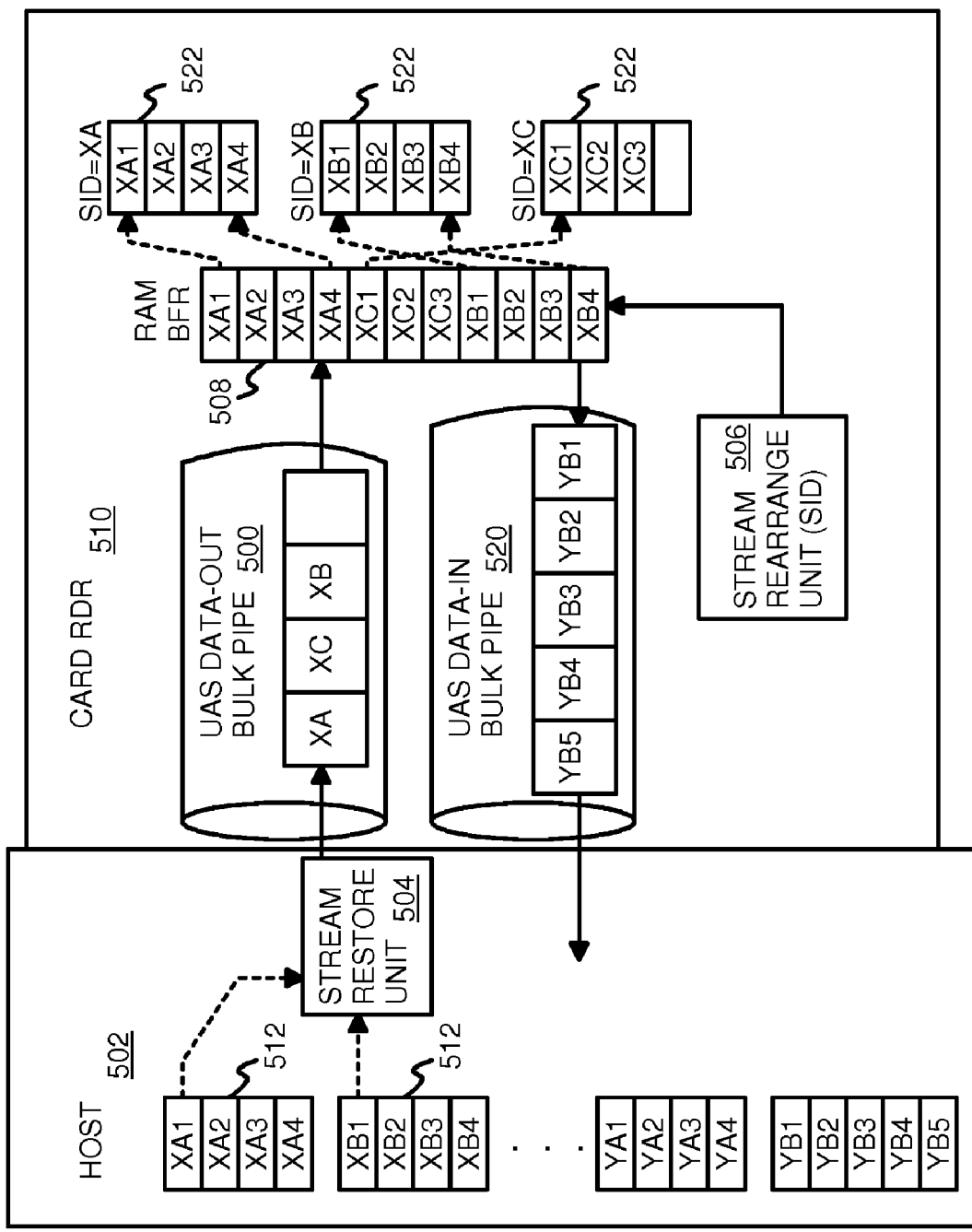
FIG. 18 illustrates a card reader improving reception efficiency by using bulk streaming of multiple pipes.

FIG. 18 illustrates a card reader improving reception efficiency by using bulk streaming of multiple pipes. Card reader 510 is receiving packets from host 502. Packets from host stream buffers 512 are selected for transmission by stream restore unit 504 in host 502 and sent over the USB link to card reader 510. These packets are initially buffered by FIFO's in card reader 510 as they pass through bulk data-out pipe 500. The received packets are buffered by RAM buffer 508. Stream rearrange unit 506 examines the stream ID for each packet and moves the packets from RAM buffer 508 to one of stream buffers 522 for that SID. Thus the packets from host stream buffers 512 are rearranged into the same order and arrangement in card reader stream buffers 522.

Since the host does not have to start a new transaction for each set of packets, overhead is reduced and transmission efficiency enhanced. The host can select packets from among many stream buffers 512 for different host commands that would be separate transactions if bulk streaming were not used.

Figure 19:
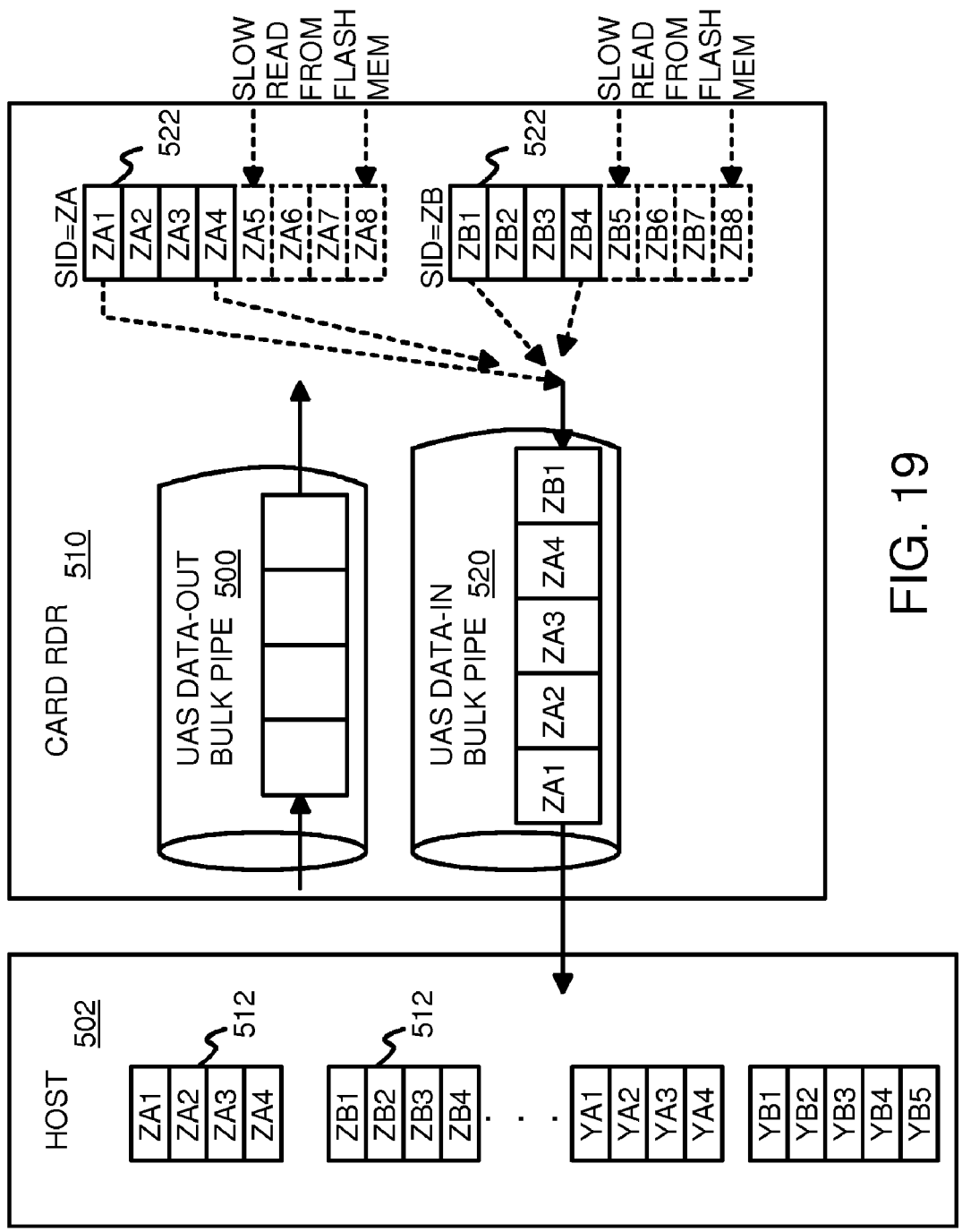
FIG. 19 illustrates a card reader improving transmission efficiency by using bulk streaming of multiple pipes.

FIG. 19 illustrates a card reader improving transmission efficiency by using bulk streaming of multiple pipes. Card reader 510 is transmitting packets to host 502 in response to several host read commands. Packets from card reader stream buffers 522 are selected for transmission by a stream rearrange unit in card reader 510 and sent over the USB link to host 502. These packets pass through bulk data-in pipe 520 in card reader 510.

The packets received by host 502 are moved to the host stream buffer 512 identified by the Stream ID for each packet. Thus the packets from host stream buffers 512 are loaded in the same order and arrangement as in card reader stream buffers 522.

Reading from flash memory is a relatively slow operation. In this example, the first four packets of data read from the flash memory is read fairly quickly, but the next four packets of data are delayed due to the slow access of different banks of flash memory. Card reader stream buffer 522 for SID=ZA is quickly loaded with the first four packets of read data ZA1, ZA2, ZA3, ZA4, but the next four packets of read data ZA5, ZA6, ZA7, ZA8 are not yet ready. Rather than wait for these additional packets, Stream rearrange unit 506 (FIG. 18) of card reader 510 selects four packets of data from stream buffer 522 with SID=ZB for transmission. These packets ZB1, ZB2, ZB3, ZB4 are transmitted through bulk data-in pipe 520 while packets ZA5, ZA6, ZA7, ZA8 are still waiting to be read from the flash memory. Thus read efficiency is improved by using several bulk stream buffers for the bulk data-in pipe.

Figure 20A:
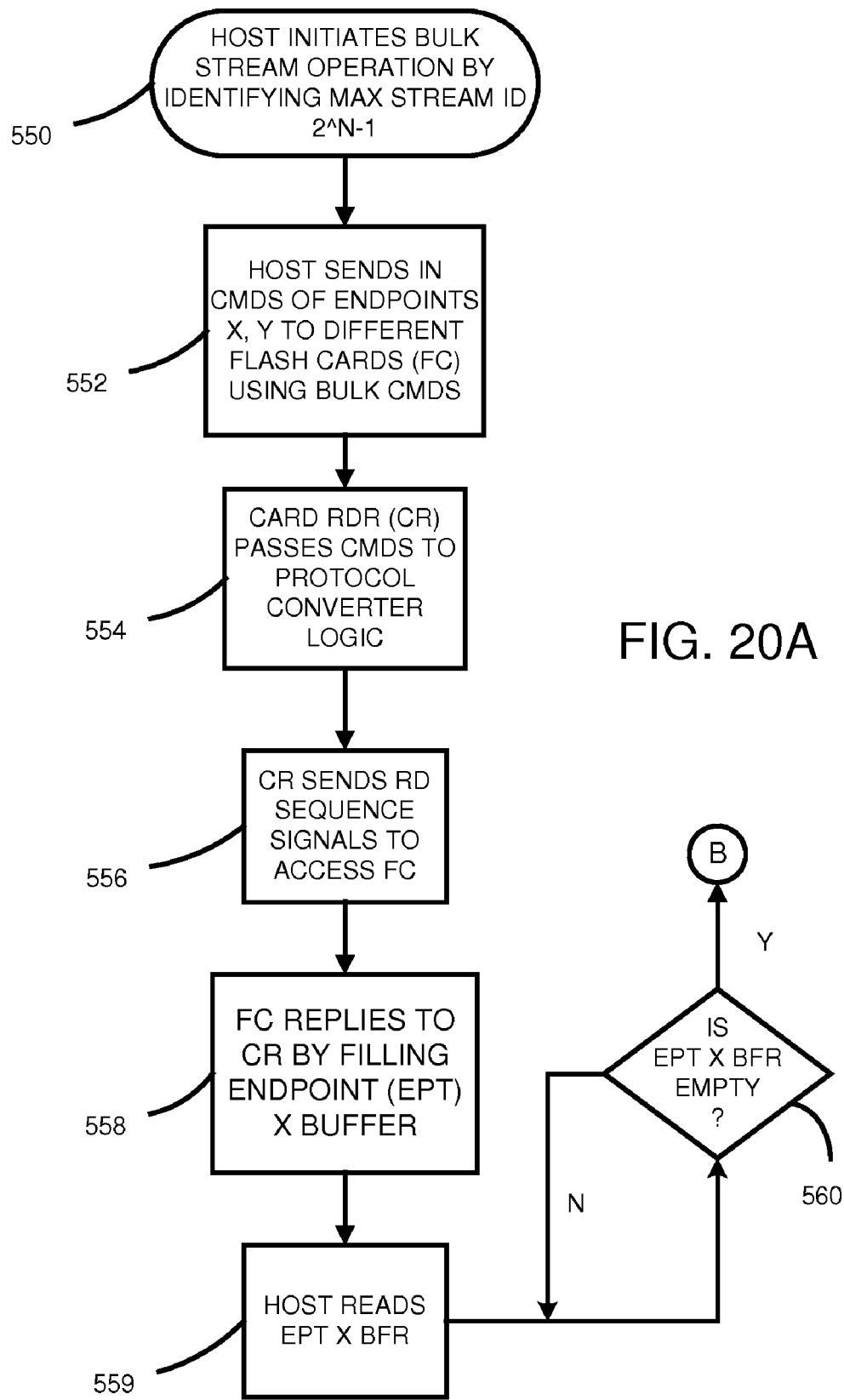
FIGS. 20A-C show a flowchart of a card reader using bulk streaming to improve transmission efficiency.
Figure 20B:
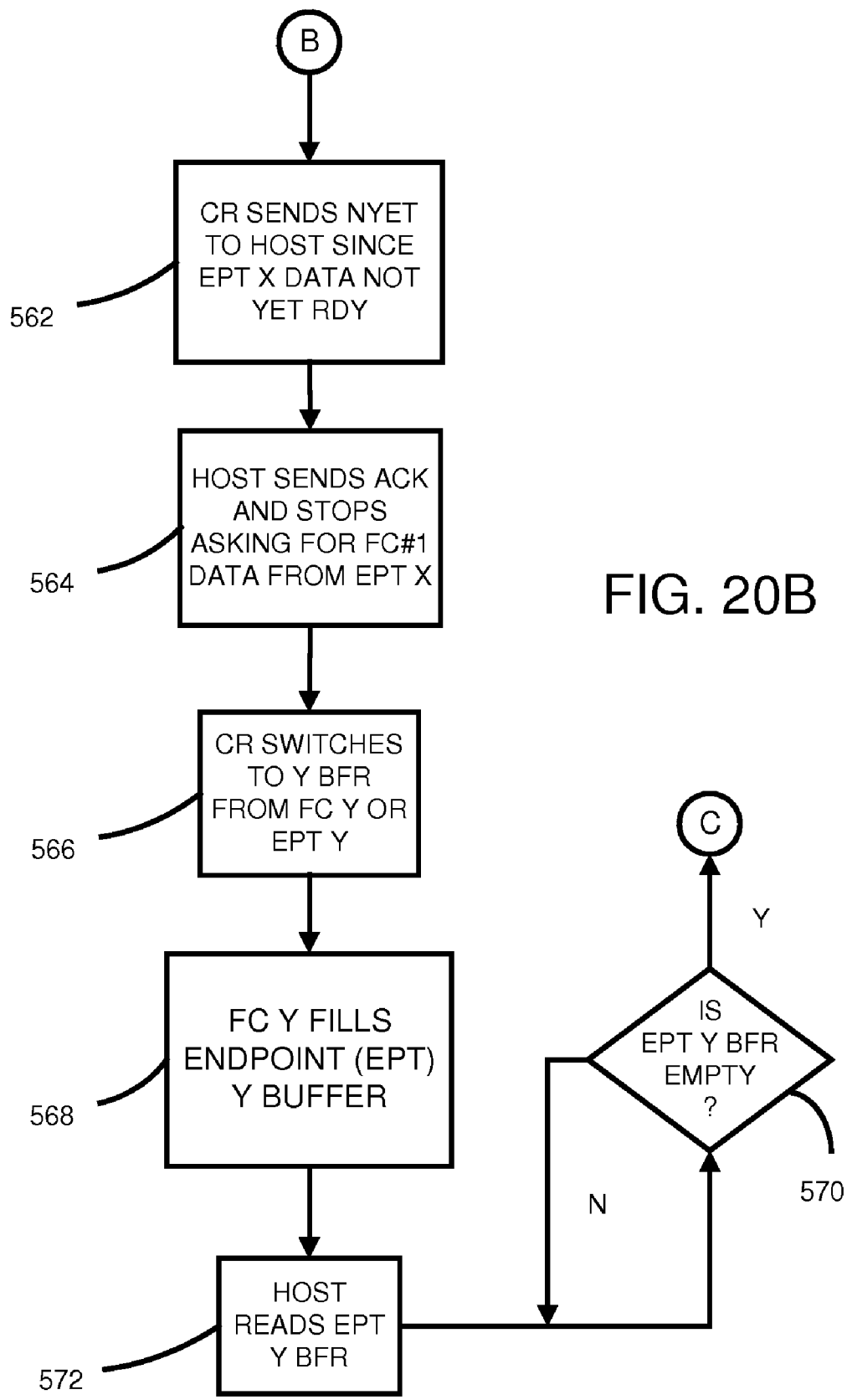
Figure 20C:
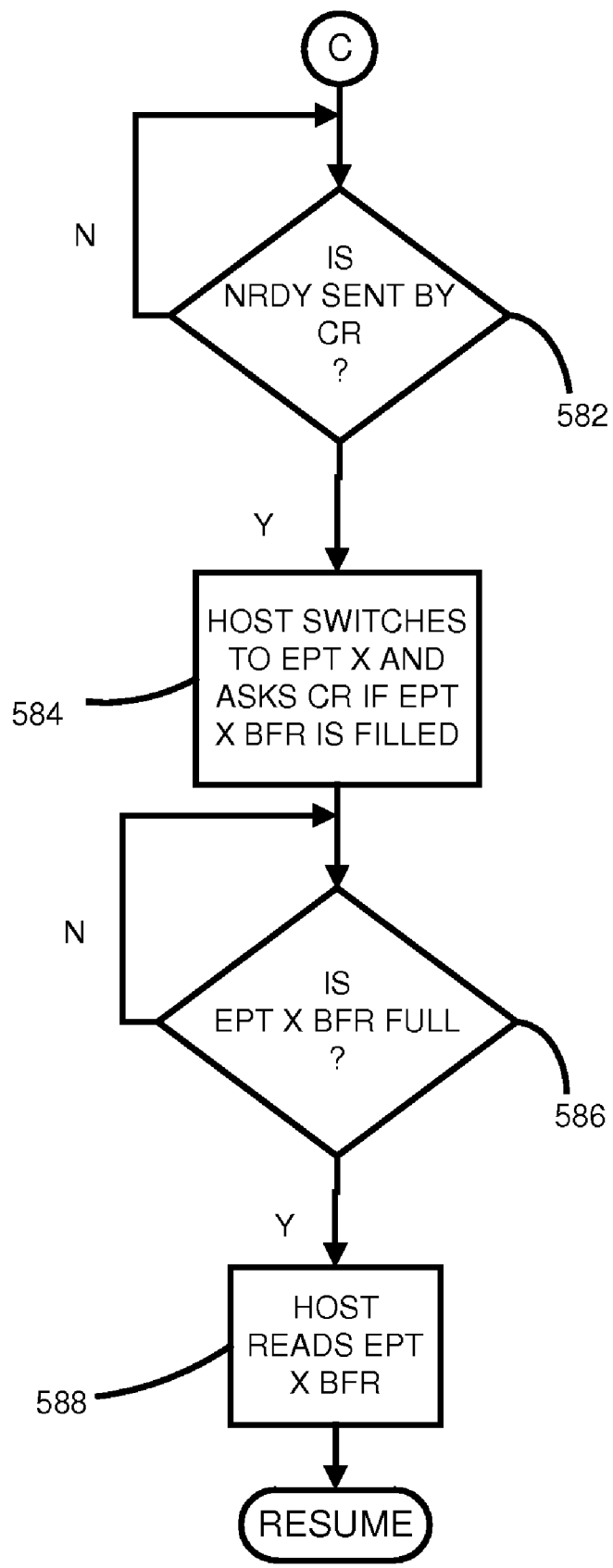

FIGS. 20A-C show a flowchart of a card reader using bulk streaming to improve transmission efficiency. In FIG. 20A, the host initiates bulk streaming by identifying a maximum value for the Stream ID that is a power of 2, or $2^N-1$, step 550. For example, the host may allow for SID=0 to 127, or up to 128 separate streams. The actual SID for each command is assigned by the host when the host write or host read command is issued.

The host then issues commands to two different endpoints X, Y, step 552. These endpoints X, Y are in different flash cards that are accessed by the card reader. Separate bulk streams are used for each endpoint. For example, access of endpoint X and be assigned SID=14, and access of endpoint Y can be assigned SID=15.

The host sends the commands to the card reader over the USB link, and the card reader buffers these commands to the protocol converter logic (312 in FIG. 9) for each flash card, step 554. The card reader then generates the physical signals to access the flash card in a read sequence of signals, step 556. The flash card reads the data requested by the host in the host read command issued in step 552, and this read data is loaded into the bulk stream buffer for endpoint X, step 558, such as stream buffer 522 with SID=ZA in FIG. 19. The host reads the data from the endpoint X stream buffer, step 559, until the stream buffer is emptied, step 560.

Once the stream buffer is empty, step 560, the card reader cannot read more data from that flash card for endpoint X. In FIG. 20B, the card reader sends a NYET signal in a status packet back to the host, step 562, and the host sends an acknowledgement packet and stops asking for additional data from endpoint X, step 564. The host then switches to reading data from endpoint Y, step 566.

The card reader also had earlier sent the read command to the endpoint Y protocol converter logic, and the other flash card for endpoint Y was accessed, step 566. The flash card was read and filled the stream buffer for endpoint Y, step 568, such as stream buffer 522 with SID=ZB in FIG. 19. The host reads the data from the endpoint Y stream buffer, step 572, until the stream buffer is emptied, step 570.

In FIG. 20C, once the card reader sends the NYET when the Y endpoint is emptied, step 582, then the host switches back to the X endpoint, step 584. The host checks the status of EPT X by sending an IN ACK, which is a Status Packet as defined by FIG. 12C, and the Card Reader replies with a ERDY to tell the host that data is available for reading. The host send the IN ACK status packet to see if the card reader has finished filling the X endpoint stream buffer with the next read data (such as packets ZA5-ZA8 of FIG. 19). Once the card reader sends a status reporting that the X buffer is full, step 586, then the host reads the data from the endpoint X stream buffer, step 588.

Figure 21:
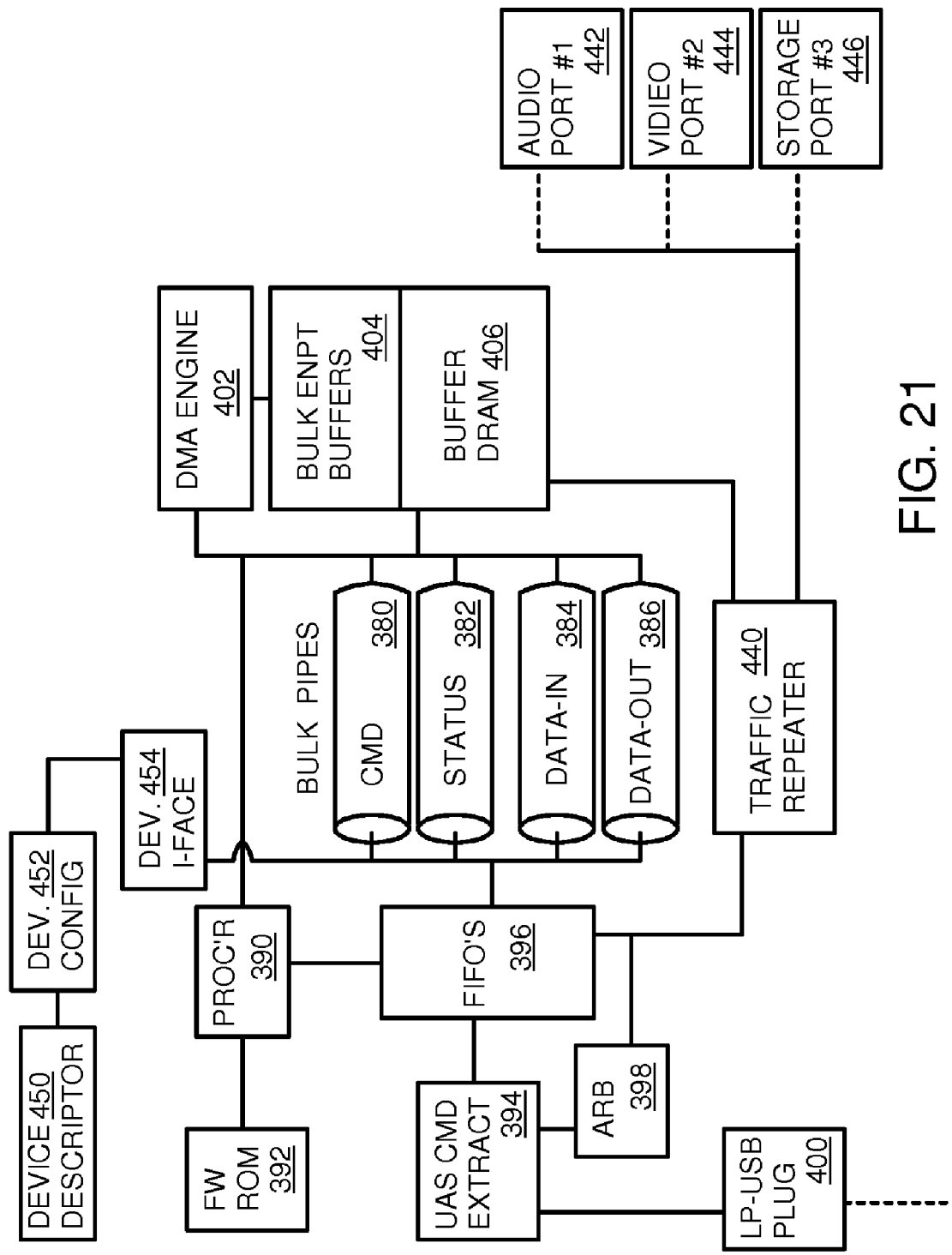
FIG. 21 is a diagram of a UAS device using bulk streaming.

FIG. 21 is a diagram of a UAS device using bulk streaming. Low-power USB plug 400 is for a USB cable that plugs into a host. UAS command extractor 394 extracts the UAS commands from the USB packets and loads headers and payloads into FIFOs 396 for the logical bulk pipes. The logical flow pipes include command pipe 380, status pipe 382, data-in pipe 384, and data-out pipe 386. All are bulk-mode pipes.

The endpoints of the streams that flow through these logical pipes are physical registers in bulk endpoint registers 404. These can be separate registers or can be memory locations in buffer DRAM 406. Processor 390 executes routines in firmware read-only memory (ROM) 292 to program direct-memory access (DMA) engine 402 to transfer payload and headers through the bulk pipes between FIFOs 396 (the host initiator side of the pipes) and buffer DRAM 406 (the target side of the pipes).

Arbiter 398 searches addresses in FIFOs 396 for matches that indicate conflicts. These address conflicts must be processed in a specific order according to ordering rules. A blocking flag can be set when an address match is detected. Traffic repeater 440 sends host commands, data, and addresses to IO ports 442, 444, 446, which can be downstream USB ports. Addresses and data can be sent from the endpoints in buffer DRAM 406 to IO ports 442, 444, 446 by traffic repeater 440. IO ports 442, 444, 446 can include video ports, audio ports, and storage extension ports for adding storage capacity and can be added by an end user.

Descriptor 450 contains configuration registers that can be programmed by a host using configuration logic 452 that is activated by interface 454. Thus a generalized device may benefit from using bulk streaming as does the card reader. Downstream peripherals could be flash cards, video input devices, video output devices, Ethernet or other network devices, rotating disks, or other device classes. Separate power may be applied to the downstream devices, or they can obtain power from a hub or from the generalized device.

Alternate Embodiments

Several other embodiments are contemplated by the inventors. For example, while a PC host 330 was shown in FIGS. 1A-1B, other kinds of hosts could be substituted, such as digital cameras, smart phones, tablet PC's, media readers and players, and other handheld devices. The card reader could be integrated with other devices, and could be a multi-function peripheral device or another kind of mass storage device other than flash. Other kinds of peripherals such as external hard disks could be adapted to use the controllers described herein. The flash cards could have other types of non-volatile storage memory, such as rotating disks, phase change memory, magnetic RAMs, etc.

Various bus topologies and arrangements of flash memory, controllers, buffers, pipes, etc. are possible. USB 3.0 may be modified, or other versions of USB may be modified. A variety of bus timings and sequences may be supported. Not all pipes may be present, depending on the transfer modes supported. The number of endpoints and buffers may be greater than that shown in the simplified examples.

The host may enter a suspend or sleep mode when the not ready (NRDY) signal is received. Instead of USB or other differential buses mentioned above, SD, MicroSD, MMC, or microMMC interfaces can also be applied in this invention. Busses may be SD buses, or a bus for Memory Stick (MS), Compact Flash (CF), IDE bus, etc. Additional pins can be added or substituted. A multi-bus-protocol chip could have an additional personality pin to select which bus interface to use, or could have programmable registers.

The device package can be a COB (Chip-on-board), PCBA (PCB Assembly), or the device itself can be inside another mechanical package such as a COB uSD inside a regular SD card package. The card reader may use one or more such devices, and can be in a separate chassis or integrated within the host's chassis, or may be integrated onto the host motherboard.

Non-volatile memory (NVM) such as flash memory may use interface signals such as traditional 8 or 16 bit single data rate (SDR) parallel input-output plus command strobes such as Read/Write, chip select, clock input, etc. The interface can also be high speed double data rate (DDR) serialized data streamed IO, with the help of synchronous DDR interface and Data Query Strobe (DQS). The free running clock, which traditional NVM needs, can be eliminated to further save power and effectively increase NVM operating speed. The interface can be either Toggle NAND or ONFI standard flash memory, or some other standard.

Various block or page sizes may be used, such as 1K, 2K, 4K, 8K, etc. Flash blocks may have 4 pages, 8 pages, 64 pages, or some other number, depending on the physical flash chips and arrangement used.

While the invention has been described using an USB controller, a SD, MMC, PCIE, or other controller may be substituted. A combined controller that can function for multiple interfaces may also be substituted.

Mode logic could sense the state of a pin only at power-on rather than sense the state of a dedicated pin. A certain combination or sequence of states of pins could be used to initiate a mode change, or an internal register such as a configuration register could set the mode.

The processor, components such as the protocol layers, bus interfaces, DMA, flash-memory controller, transaction manager, and other controllers and functions can be implemented in a variety of ways. Functions can be programmed and executed by the CPU or other processor, or can be implemented in dedicated hardware, firmware, or in some combination. Many partitioning of the functions can be substituted.

Data and commands may be routed in a variety of ways, such as through data-port registers, FIFO or other buffers, the CPU's registers and buffers, DMA registers and buffers, and flash registers and buffers. Some buffers may be bypassed or eliminated while others are used or present. Virtual or logical buffers rather than physical ones may also be used. Data may be formatted in a wide variety of ways.

Other stream and transaction types or variations of these types can be defined for special purposes. These commands may include a flash-controller-request, a flash-controller-reply, a boot-loader-request, a boot-loader-reply, a control-program-request, a control-program-reply, a flash-memory-request, and a flash-memory-reply. The flash-memory request/reply may further include the following request/reply pairs: flash ID, read, write, erase, copy-back, reset, page-write, cache-write and read-status.

The host may be a personal computer (PC), a portable computing device, a digital camera, a phone, a personal digital assistant (PDA), a smart phone or tablet, or other electronic device. The partition of RAM among various functions could change over time.

Wider or narrower data buses and flash-memory blocks could be substituted, such as 4, 5, 8, 16, 32, 64, 128, 256-bit, or some other width data channels. Alternate bus architectures with nested or segmented buses could be used internal or external to a controller or microcontroller. Two or more internal and flash buses can be used in the USB flash microcontroller to increase throughput. More complex switch fabrics can be substituted for the internal buses. Redundant Array of Individual Disks (RAID) can be supported by redundant storage in channels or flash devices. Combining 1 KB USB packets into 8 KB payloads could be performed by the RAM buffer or DMA, and other payload and packet sizes could be substituted. Some packets may me smaller than the maximum size, and there may be empty space in payloads, or payloads may have a variable size.

The physical layer to the flash memory can receive physical signals with a predetermined pin assignment. The predetermined pin assignment may be based on a pin count of the flash-memory card. The pin assignment may include one set of two pairs of differential serial buses: (i) a first pair differential serial bus with a first pin carry+signal and a second pin carry−signal, and (ii) a second pair differential serial bus with a first pin carry+signal and a second pin carry−signal. In an alternative design, extra pairs of differential serial bus can increase performance by adding pairs of such high speed serial differential signal lines. The USB link to the host can also have one set of two pairs of differential serial buses: (i) a first pair differential serial bus with a first pin carry+signal and a second pin carry−signal, and (ii) a second pair differential serial bus with a first pin carry+signal and a second pin carry−signal.

The flash mass storage chips or blocks or Non-Volatile Memory Devices (NVMDs) can be constructed from any flash technology including multi-level-logic (MLC) memory cells and single level cells (SLC). Phase change memory may be used as flash memory. Data striping could be used with the flash mass storage blocks in a variety of ways, as can parity and error-correction code (ECC). Data re-ordering can be adjusted depending on the data arrangement used to prevent re-ordering for overlapping memory locations. A hub or switch such as port multiplier could be integrated with other components such as a Smart Storage Switch. While a single-chip device has been described, separate packaged chips or die may be stacked together while sharing I/O pins, or modules may be used.

A microcontroller can generate a not-yet signal that is transmitted to the host over the transmit pair when the RAM buffer does not yet contain requested data that is waiting to be read from the flash memory. The not-yet signal is transmitted over the transmit pair when the requested data is waiting to be read from the flash memory.

The busy LP USB card reader sends a not-yet NYET signal back to the LP USB host to instruct the host to continue with other tasks without waiting. When the LP USB card reader is ready to continue transfer with the host, the LP USB card reader wakes up the host by sending a ready RDY signal back to the host for resuming the previous transfer. This improvement can dramatically save host power without waiting and continuing polling the card reader status. Also if several LP devices are connected with host, only one addressed LP card reader will be accessing the host, the other non-related devices will not be disturbed for power-saving purposes. This non-broadcast feature for host communication with devices is another way to reduce power of LP USB systems.

A chained Direct-Memory Access (DMA) has been described. Registers in a DMA controller point to a vector table that has vector entries; each pointing to a destination and a source. The source is a memory table for a memory group. The memory table has entries for several memory segments. Each memory-table entry has a pointer to a memory segment and a byte count for the segment. Once all bytes in the segment are transferred, a flag in the entry indicates when another memory segment follows within the memory group.

A clock circuit may include a power-saving state machine to control the clock oscillator that generates different clock rates used by the system. The power-saving state machine includes active enable circuit responsive to a host clock data rate recovered by receive clock RX_CK and a host LP command. Active enable circuit 520 detects the absence of a host command for a predetermined period of time and when the predetermined period of time exceeds a threshold value, power saving arbitrator mux 538 selects the lower clock rate output from clock divider 522 to the system to reduce power consumption of the system.

The card reader can save more power when activities are idle, and then by entering to the low power mode state after a predetermined time elapses and then back to the normal state when activities are detected. The total power consumption of the card reader may be lowered by introducing data encoding schemes and other features for future mobile applications, such as film storage in cell phones.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A card reader comprising:
a transmit pair for sending packets to a host;
a receive pair for receiving packets from the host;
wherein the transmit and receive pair comprise a differential bus with a first pin carry+signal and a second pin carry−signal from host as the receive pair, and a second pair differential serial bus with a first pin carry+signal and a second pin carry−signal to the host as the transmit pair;
an input buffer for buffering packets from the receive pair and for buffering packets to the transmit pair;
a command extractor for extracting commands from the packets from the host;

a command pipe for flowing commands from the host to the card reader;
a status pipe for flowing status packets from the card reader to the host;
a bulk data-out pipe for flowing data packets from the host to the card reader;
a bulk data-in pipe for flowing data packets from the card reader to the host;
bulk endpoint buffers comprising:
   a status bulk-in endpoint that sends status packets to the host through the status pipe;
   a data bulk-in endpoint that sends data packets to the host through the bulk data-in pipe;
   a data bulk-out endpoint that receives data packets from the host through the bulk data-out pipe;
   a command endpoint that receives command packets from the host through the command pipe;
a processor for executing control routines;
a chaining direct-memory access (DMA) engine, programmed by the processor to transfer data packets including headers and payloads between the input buffer and the bulk endpoint buffers;
a flash-card socket for receiving a flash memory card; and
a flash-card protocol converter, coupled to the bulk endpoint buffers, for converting commands extracted by the command extractor into flash-card signals for accessing the flash memory card inserted into the flash-card socket,
whereby packets are flowed through pipes using the chaining DMA engine.

2. The card reader of claim 1 wherein data packets for different host commands are identified by a stream identifier in the data packet;
   wherein data packets for different host commands are flowed together through the bulk data-in pipe and the bulk data-our pipe,
   whereby data packets with different stream identifiers are flowed together through the bulk data-our pipe.

3. The card reader of claim 2 further comprising:
a plurality of flash-card sockets each for receiving a flash memory card;
a plurality of stream buffers, wherein each stream buffer stores packets having a same stream identifier value;
a stream rearrange unit that sorts data packets received by the data bulk-out endpoint into the plurality of stream buffers using the stream identifiers for sorting decisions,
whereby data packets are sorted by stream identifier into the plurality of stream buffers.

4. The card reader of claim 3 further comprising:
a data in/out streaming state machine for controlling streaming of data packets through the bulk data-in pipe and through the bulk data-out pipe; and
a status streaming state machine for controlling streaming of status packets through the status pipe.

5. The card reader of claim 4 wherein the data in/out streaming state machine comprises:
a D-Enter state activated when the host sends a first command to the card reader;
a D-Idle state activated when the card reader sends a not-ready signal to the host;
a D-Start state activated when the card reader sends a ready signal to the host;
a D-Burst state activated while the host is bursting data packets to the card reader.

6. The card reader of claim 4 wherein the status streaming state machine comprises:
a S-Enter state activated when the card reader sends an acknowledgement to the host;
a S-Idle state activated when the card reader sends a not-ready signal to the host;
a S-Start state activated when the card reader sends a ready signal to the host;
a S-Burst state activated while the card reader is bursting status packets to the host.

7. The card reader of claim 3 further comprising:
a plurality of flash physical layers coupled between the plurality of flash-card sockets and a plurality of the flash-card protocol converter.

8. The card reader of claim 3 wherein the input buffer comprises a plurality of first-in-first-out (FIFO) buffers.

9. The card reader of claim 3 further comprising:
an arbiter, coupled to the command extractor and the input buffer, for activating a blocking flag when addresses for commands overlap.

10. The card reader of claim 3 further comprising:
a low-power physical layer for driving packets to the transmit pair and for receiving packets from the receive pair;
a low-power link layer, coupled to the low-power physical layer, for generating and processing link control words for controlling link power and for link training; and
a protocol layer for pointing to headers and payloads in the bulk endpoint buffers for transfer to the low-power link layer.

11. The card reader of claim 10 wherein the low-power physical layer further comprises:
a driver for driving the transmit pair with a transmit data stream;
a bit clock for clocking bits of the transmit data stream;
a parallel-to-serial converter, clocked by the bit clock, for converting data bytes for transmission to serial data for transmission by the driver;
a receiver for detecting signal transitions on the receive pair;
a receive clock recovery circuit, coupled to the receiver, for generating a received bit clock from signal transitions detected by the receiver;
a symbol boundary detector for detecting boundaries of symbols received by the receiver;
a serial-to-parallel converter, clocked by the received bit clock, for converting an extracted data stream to received data bytes; and
an elastic buffer for storing the received data bytes.

12. The card reader of claim 11 wherein the low-power physical layer further comprises:
a low-frequency periodic signal generator, receiving the bit clock, for generating a low-frequency periodic signal;
a mux, receiving the low-frequency periodic signal and receiving the transmit data stream, for applying the low-frequency periodic signal to the driver when a power-down mode is enabled, and for applying the transmit data stream to the driver when the power-down mode is not enabled.

13. The card reader of claim 11 further comprising:
a Universal-Serial-Bus (USB) socket for receiving a cable with the transmit pair and the receive pair;
wherein the low-power physical layer comprises a USB 3.0 physical layer;
wherein the flash-card protocol converter converts USB to a flash card interface.

14. A bulk streaming device comprising:
a Universal-Serial-Bus (USB) port for connecting to a host over a receive pair and a transmit pair of lines;
a physical layer coupled to the USB port to receive a received data stream from the receive pair, and to transmit a transmit data stream to the transmit pair;
a link layer, coupled to the physical layer, for processing link control words received from the host over the receive pair, for controlling link power and link training;
a first-in-first-out (FIFO) buffer, coupled to the link layer, for storing packets passed through the link layer;
a command pipe for flowing commands from the host to the bulk streaming device;
a status pipe for flowing status packets from the bulk streaming device to the host;
a bulk data-out pipe for flowing data packets from the host to the bulk streaming device;
a bulk data-in pipe for flowing data packets from the bulk streaming device to the host;
a RAM buffer for storing status packets and data packets, the RAM buffer including bulk endpoint buffers that comprise:
 a status bulk-in endpoint that sends status packets to the host through the status pipe;
 a data bulk-in endpoint that sends data packets to the host through the bulk data-in pipe;
 a data bulk-out endpoint that receives data packets from the host through the bulk data-out pipe;
 a command endpoint that receives command packets from the host through the command pipe;
a processor for executing control routines;
a direct-memory access (DMA) engine, programmed by the processor to transfer data packets including headers and payloads between the FIFO buffer and the bulk endpoint buffers;
a plurality of port sockets each for connecting to a downstream peripheral; and
a traffic repeater, coupled to the bulk endpoint buffers, for converting commands from the host into peripheral signals for accessing the downstream peripheral inserted into a port socket,
whereby packets are flowed through pipes using the DMA engine.

15. The bulk streaming device of claim 14 wherein the downstream peripheral comprises a flash memory card or a USB device.

16. The bulk streaming device of claim 14 further comprising:
a read-only memory (ROM), coupled to the processor, for storing control instructions for the control routines executed by the processor.

17. The bulk streaming device of claim 14 wherein the link layer further comprises:
a sequence number generator for generating sequence numbers for link packets;
a CRC generator/checker for generating and checking link CRC's;
a link power manager, responsive to link control words from the host, for managing link power on the transmit pair; and
a link trainer, responsive to link training patterns from the host, for configuring the receive pair and the transmit pair.

18. The bulk streaming device of claim 14 wherein the receive pair and the transmit pair together comprise a set of two pairs of differential serial buses, a first pair bus with a first pin carry+signal and a second pin carry−signal, and a second pair differential serial bus with a first pin carry +signal and a second pin carry−signal.

19. The bulk streaming device of claim 18 wherein the physical layer further comprises:
an 8/10-bit encoder/decoder for converting 10-bit symbols from the received data stream into 8-bit received data bytes, and for converting 8-bit transmit data bytes into 10-bit transmit symbols to form the transmit data stream; and
a descrambler for descrambling the 8-bit received data bytes and for scrambling the 8-bit transmit data bytes.

20. A bulk-streaming card reader comprising:
transmit pair means for sending packets to a host;
receive pair means for receiving packets from the host;
wherein the transmit pair means and receive pair means comprise a differential bus with a first pin carry+signal and a second pin carry−signal from host as the receive pair means, and a second pair differential serial bus with a first pin carry+signal and a second pin carry−signal to the host as the transmit pair means;
input buffer means for buffering data packets from the receive pair means and for buffering packets to the transmit pair means;
command extractor means for extracting commands from the packets from the host;
command pipe means for flowing commands from the host to the bulk-streaming card reader;
status pipe means for flowing status packets from the bulk-streaming card reader to the host;
bulk data-out pipe means for flowing data packets from the host to the bulk-streaming card reader;
bulk data-in pipe means for flowing data packets from the bulk-streaming card reader to the host;
bulk endpoint buffers comprising:
 status bulk-in endpoint means for storing status packets for transmission to the host through the status pipe means;
 data bulk-in endpoint means for storing data packets for transmission to the host through the bulk data-in pipe means;
 data bulk-out endpoint means for storing data packets received from the host through the bulk data-out pipe means;
 command endpoint means for storing command packets received from the host through the command pipe means;
processor means for executing control routines;
direct-memory access (DMA) means, programmed by the processor means, for transferring data packets including headers and payloads between the input buffer means and the bulk endpoint buffers;
a flash-card socket for receiving a flash memory card;
flash-card protocol converter means, coupled to the bulk endpoint buffers, for converting commands extracted by the command extractor means into flash-card signals for accessing the flash memory card inserted into the flash-card socket;
data in/out streaming state machine means for controlling streaming of data packets through the bulk data-in pipe means and through the bulk data-out pipe means; and
status streaming state machine means for controlling streaming of status packets through the status pipe means,
whereby packets are flowed through pipes.

21. The bulk-streaming card reader of claim 20 further comprising:
a plurality of a flash-card sockets each for receiving a flash memory card.

* * * * *